United States Patent [19]

Yokoyama et al.

[11] Patent Number: 5,675,548
[45] Date of Patent: Oct. 7, 1997

[54] SEMICONDUCTOR INTEGRATED CIRCUIT HAVING LOGI GATES

[75] Inventors: Yuji Yokoyama; Takashi Akioka; Masahiro Iwamura, all of Hitachi; Atsushi Hiraishi, Oume; Yutaka Kobayashi, Katsuta; Tatsumi Yamauchi, Hitachi; Shigeru Takahashi, Hitachiohta; Nobuyuki Gotou; Akira Ide, both of Takasaki, all of Japan

[73] Assignee: Hitachi, Ltd., Tokyo, Japan

[21] Appl. No.: 608,605

[22] Filed: Feb. 29, 1996

Related U.S. Application Data

[62] Division of Ser. No. 383,866, Feb. 6, 1995, Pat. No. 5,544,125, which is a division of Ser. No. 643,372, Jan. 22, 1991, Pat. No. 5,387,827.

[30] Foreign Application Priority Data

Jan. 20, 1990 [JP] Japan .................. 2-010946
Feb. 27, 1990 [JP] Japan .................. 2-046717

[51] Int. Cl.⁶ .................................. G11C 8/00
[52] U.S. Cl. ...................... 365/230.06; 365/189.01
[58] Field of Search ............... 365/189.01, 189.05, 365/230.06

[56] References Cited

U.S. PATENT DOCUMENTS

| 4,091,293 | 5/1978 | Ando | 326/121 |
| 4,724,341 | 2/1988 | Yamada et al. | 326/108 |
| 4,758,744 | 7/1988 | Plus | 326/108 |
| 4,841,488 | 6/1989 | Sanada | 365/189.01 |
| 4,899,316 | 2/1990 | Nagami | 365/189.01 |
| 5,001,367 | 3/1991 | Vinal | 326/121 |
| 5,416,743 | 5/1995 | Allan | 365/189.01 |

OTHER PUBLICATIONS

IEEE Journal of Solid–State Circuits, vol. 23, No. 5, Oct. 1988, "A 15–ns 1–Mbit CMOS SRAM", K. Sasaki, et al., pp. 1067–1072.

Digest of Technical Papers, 1988 IEEE International Solid–State Circuits Conference "A 12ns 256K BiCMOS SRAM", R. Kertis, et al., pp. 186–187.

Primary Examiner—A. Zarabian
Attorney, Agent, or Firm—Antonelli, Terry, Stout & Kraus, LLP.

[57] ABSTRACT

An arrangement which is particularly effective for decoders in semiconductor memory circuits which use, for example, common NMOS to receive one input for a plurality of logic decoder gates is provided includes a plurality of logic gates each having a first input terminal for respectively receiving first input signals and each being coupled to a common node. In one embodiment, first and second switching elements are also coupled to the common node. The first and second switching elements are both coupled to a second input terminal for receiving a second input signal which is common to the plurality of logic gates, and both operate complementary to one another in response to the second input signal. An improved read/write arrangement is also provided for such semiconductor memory circuit which includes circuitry to prevent connection of a common read line to the data lines during the writing operation. This enhances the writing speed by removing the load of the common read line during writing.

34 Claims, 22 Drawing Sheets

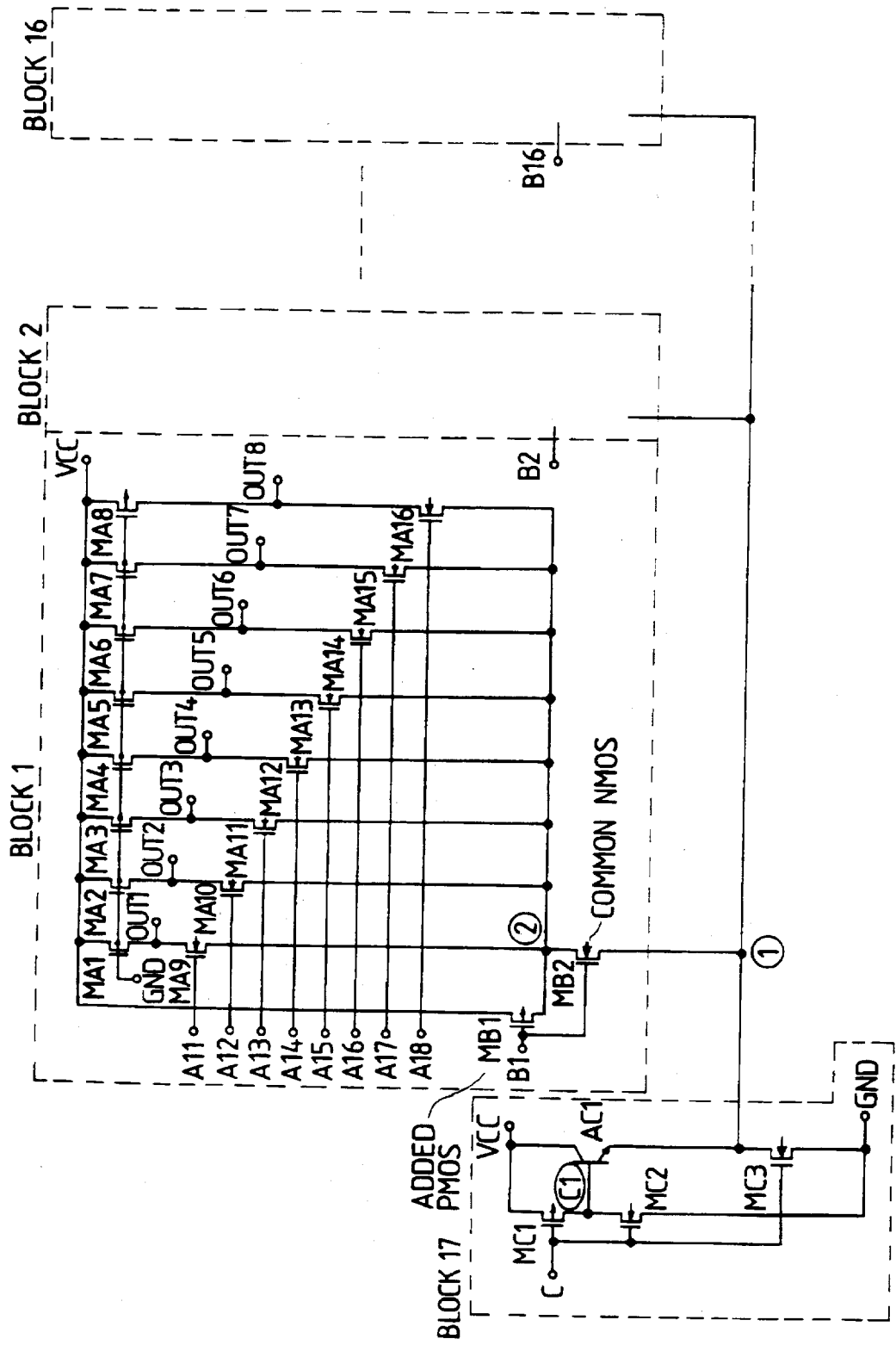

SEMICONDUCTOR INTEGRATED CIRCUIT HAVING LOGI GATES

This is a divisional of application Ser. No. 08/383,866, filed Feb. 6, 1995, U.S. Pat. No. 5,544,125; which is a divisional of application Ser. No. 07/643,372, filed Jan. 22, 1991, now U.S. Pat. No. 5,387,827.

BACKGROUND OF THE INVENTION

The present invention relates to a high-speed integrated semiconductor circuit having logic gates, and, more particularly, to such a circuit which is suitable to a semiconductor device having a memory function. In accordance with one aspect of the present invention, the logic gates can be used for a decoder circuit of a semiconductor device having a memory function.

A decoder circuit which is composed of MOS transistors and in which 8 logic gates have an input gate in common is described in, for example, an article by Katsuro Sasaki et al entitled "A 15-ns 1 Mbit CMOS SRAM" in the IEEE JOURNAL OF SOLID-STATE CIRCUITS, Vol. 23, No. 5, 1988, pp. 1067–1072. An example of such a decoder circuit in which 8 logic gates have an input gate in common is shown in FIG. 1. This circuit represents 8 two-input NAND gates. As can be seen in FIG. 1, the circuit includes 8 first PMOS transistors (PMOS load), 8 first NMOS transistors, and one second NMOS transistor that is common for all of the logic gates.

In FIG. 1, the drain of a first PMOS transistor is connected to the drain of a corresponding first NMOS transistor, and the source of the corresponding first NMOS transistor is connected to the drain of a second NMOS transistor which has an input gate which receives a common input for all of the NAND gates. The second NMOS transistor is represented by COMMON NMOS FOR 8 NANDS in FIG. 1. These three kinds of MOS transistors constitute one NAND gate.

The operational state of each of the two-input NAND gates of FIG. 1 is generally classified into four operational states. If it is assumed that the two input terminals are A and B, when both A and B are at a Low level, the output is at a High level. On the other hand, when A is at a Low level and B is at a High level and when A is at a High level and B is at a Low level, the output is at a High level. It is only when both A and B are at a High level that the output is at a Low level.

If it is assumed that the gate of the first NMOS transistor is the input A and the gate of the second NMOS transistor is the input B, when either A or B is at a Low level, either the first NMOS transistor or the second NMOS transistor is turned off, and the output is at a High level. On the other hand, when both A and B are at a High level, both the first NMOS transistor and the second NMOS transistor are turned on and the output is at a Low level.

When a signal to the input gate B of the second NMOS transistor changes from a High level to a Low level and the output thereby changes from a Low level to a High level, the current flowing out of a first PMOS transistor passes through the corresponding first NMOS transistor in the ON state, charges the source-side junction capacitances of the other first NMOS transistors in the OFF state, and thereafter supplies an output at a High level. Therefore, the period from the time when the input signal is changed to the time when the output signal is changed (operation delay time) is inconveniently long. The number of the logic gates which have the input gate B in common is not limited to 8. Therefore, the operation delay time in such a circuit arrangement would further increase with an increase in the number of the logic gates which have the input gate in common.

The delay time between the instant a signal is input to the input portion of a decoder circuit so as to select one memory cell and the instant a signal is output from the output portion is generally determined by the number of stages of logic gates which constitute the decoder circuit. Therefore, it is necessary to reduce the number of stages of logic gates in order to speed up the decoder circuit.

However, when the number of stages of logic gates is reduced, the fan out of the output portion of the logic gate increases and, hence, the capacitance of the gate which is connected to the output portion increases. Consequently, the delay time of the logic gate and, hence, the delay time of the decoder circuit are rather prolonged.

As a result, a speed-up method by a reduction in the number of stages of logic gates and a speed-up method by a reduction in the number of the fan outs are opposed to one another so that a prominent effect on the speedup of the decoder circuit has not hitherto been achieved.

Rapid progress has recently been made in the high integration of a memory. The progress in the high integration of a memory and the increase in the number of memory cells necessitate an increase in the number of stages in the decoder circuit for selecting a memory cell. The increase in the number of stages is a serious obstacle to the speedup of the decoder circuit of the memory device.

Further, to get a high-speed memory device, the control of the data writing and data reading operations are also important.

As an example of a data reading circuit and a data writing circuit, those discussed in ISSCC, Digest of Technical Papers, pp. 186–187, 1988, are conventionally known. FIG. 2 schematically shows an example of such a reading circuit and data writing circuit in the conventional semiconductor memory.

In FIG. 2, the reference numeral 1 represents a data line load circuit, the symbols D, /D represent a pair of data lines (or pair of complementary data lines), WL a word line, the reference numeral 2 represents a memory cell, 101 (M1) and 102 (M2) writing transfer gates, M3 and M4 reading transfer gates, 3 a two-input NOR gate inputting a column select signal /Yi and a writing control signal /W, 4 a decoder circuit for generating the column select signal /Yi on the basis of addresses $A_0$ to $A_n$, 10 a common read line for reading the data out of the memory cell, and 11 a common write line for writing data into the memory cell.

To the common read line 10 and the common write line 11, data lines of a plurality of columns are connected through the reading transfer gates 103 (M3) and 104 (M4) and the writing transfer gates 101 (M1) and 102 (M2), respectively.

The operation of the semiconductor memory in the prior art will be explained in the following.

The operation of reading the data from the memory cell is carried out by raising the word line WL so as to read the data held by the memory cell 2 in the form of a potential difference produced on the pair of data lines D, /D. In this case, since the process is in a reading cycle, the writing control signal /W is High and the column select signal /Yi is Low because it has been selected. Therefore, the writing transfer gates 101 (M1) and 102 (M2) are turned OFF and the reading transfer gates 103 (M3) and 104 (M4) are turned ON, so that the potential difference produced on the pair of data lines D, /D is transmitted to the common read line 10 and read out.

On the other hand, at the time of a data writing operation, since both the writing control signal /W and the column select signal /Yi are Low, all of the writing transfer gates 101 (M1) and 102 (M2) and the reading transfer gates 103 (M3) and 104 (M4) are turned ON. The data written on the common write line 11 is transmitted to the pair of data lines D, /D through the writing transfer gates 101 (M1) and 102 (M2) and written into the memory cell of the selected word line WL. The written data is also transmitted from the data lines to the common read line 10 through the reading transfer gates 103 (M3) and 104 (M4).

In the conventional semiconductor memory, the operations of reading data from the memory cell 2 and writing data into the memory cell 2 are executed in the above-described way. In the semiconductor memory in the prior art having the above-described structure of FIG. 2, the common read line 10 is charged and discharged during every data writing operation for the memory cell. Since the common read line is heavily loaded because a plurality of columns are connected thereto, the necessity of charge and discharge during every data writing operation for the memory cell disadvantageously requires a long time for writing.

When the data writing into the memory cell is finished, it is necessary to recover the potential of the data line from the potential at the time of writing to the potential at the time of reading in order to prevent false data from being written into the memory cell or to prevent the delay in the reading time immediately after the writing. In the prior art, it is necessary to recover the potential of the common read line as well as the potential of the data lines, so that much time is required for recovery, which is a serious problem.

Since the increase in the capacity of a semiconductor memory leads to the increase in the load of the common read line, such a problem is serious because of the recent requirements for a larger capacity of a semiconductor memory and a higher access speed. This problem is also contrary to the demand for a lower power dissipation.

SUMMARY OF THE INVENTION

It is one object of the present invention to provide a semiconductor integrated circuit having a plurality of logic gates which each have a small input gate capacitance in spite of a large number of fan outs so that the circuit is capable of high-speed operation.

To achieve this aim, the present invention provides a semiconductor integrated circuit including c logic gates which have b input gates among a input gates in common, the logic gates being provided with a switching element in a circuit portion which changes the potential level a node in common with the c logic gates (where a, b and c are natural numbers).

The switching element which changes a node in common with the c logic gates to a High level is concretely formed with at least one PMOS transistor.

The present invention also provides a semiconductor integrated circuit including f logic gates which have e input gates among d input gates in common (where d, e and f are natural numbers), the circuit portion which changes the potential of the node in common with the f logic gates being a composite circuit of at least one MOS transistor and at least one bipolar transistor.

In the prior art, the reason why the operational delay time is prolonged when a signal to the input gate B of the second NMOS transistor changes from a High level to a Low level and the output thereby changes from a Low level to a High level is as follows.

In FIG. 1, when a signal to the input gate B of the second NMOS transistor changes from a High level to a Low level, the second NMOS transistor turns from the ON state to the OFF state. The first PMOS transistor, however, remains in the ON state. The current flowing from the first PMOS transistor passes through the first NMOS transistor in the ON state and flows into the drain of the second NMOS transistor, thereby changing the potential of the drains of the second NMOS transistor from the Low state to the High state. Further, the current flowing from the first PMOS transistor flows into the sources of the other 7 NMOS transistors in the OFF state, and after charging the junction capacitances of the 7 sources, changes the potential to a High level. Therefore, the period from the time when the input signal is changed to the time when the output signal is changed (operational delay time) inconveniently becomes long.

To prevent this, for example, when the drain of a second PMOS transistor is connected to the drain of the second NMOS transistor and the gate of the second PMOS transistor is connected to the input gate B in common with the second NMOS transistor, the operational delay time required when a signal to the input gate B changes from a High level to a Low level is shortened. This is because when the signal to the input gate B changes from a High level to a Low level, the second NMOS transistor changes from the ON state to the OFF state and, simultaneously, the second PMOS transistor changes from the OFF state to the ON state, whereby a current flows out, so that the time for changing the potential of the drain of the second NMOS transistor to a High level is shortened.

FIGS. 8a and 8b show the waveforms of simulation which show the operational delay time shortening effect of the added second PMOS transistor. FIG. 8a shows a waveform of the operation in a conventional system and FIG. 8b shows a waveform of the operation in the present invention in which a second PMOS transistor is added. From FIGS. 8a and 8b, it is observed that by adding the PMOS transistor, the operational delay time required when the output potential changes from a Low level to a High level is shortened.

The reason why the speedup of the decoder circuit is enabled by using the above-described logic gates will be described in the following.

It is necessary to reduce the number of states of logic gates which constitute the decoder circuit in order to speed up the decoder circuit which selects a high-integration memory cell. If it is assumed that values for l, m, n, o and p are natural numbers, in the decoder circuit which consists of l logic gates, the load capacitance $C_{OUT}$ which is connected to the output portion of the logic gate at the n-th stage is the sum of the line capacitance $C_{LINE}$ and the total input gate capacitance $C_{GATE}$ of the logic gate at the next stage, namely, the logic gate a the (n+1)th state:

$$C_{OUT}=C_{LINE}+C_{GATE} \quad (1)$$

The total input gate capacitance $C_{GATE}$ of the logic gate at the next stage is represented by the subsequent equation:

$$C_{GATE}=F \times C_G \quad (2)$$

wherein F represents the number of fan outs and $C_G$ a gate input capacitance per one input gate of the logic gate at the next stage.

If the number of stages of the logic gates is reduced for the purpose of the speedup of the decoder circuit, the fan out F connected to the output portion of the logic gate at the n-th stage increases, as will be described later. If the fan-out F increases, the total input gate capacitance $C_{GATE}$ of the logic gate at the next stage increases from the equation (2), and the further the load capacitance $C_{TOTAL}$ of the logic gate at the n-th stage increases from the equation (1). Generally, when the output load capacitance of the logic gate increases, the delay time $t_{pd}$, between the instant that a signal is input to the logic gate and the instant that the signal is output, increases.

Accordingly, if the number of stages of logic gates is reduced without any improvement of the logic gate, the delay time at the logic gate is prolonged and, hence, the delay in the decoder circuit is increased.

To prevent this, in the (n+1)th stage of the logic gate that has p logic gates, if o input gates are provided in common with the p logic gates, each of which has m input gates, as shown in FIG. 9, the total input gate capacitance $C_{GATE}$ is greatly reduced in comparison with that when the input gates are not in common. In this way, the output capacitance $C_{OUT}$ connected to the output portion of the logic gate at the n-th stage is reduced from the equation (1), and the delay time of the logic gate at the n-th stage is shortened.

The total input capacitance is generally reduced by using a PMOS transistor (MA1 ... MA8, etc.) with the gate grounded as an element for changing the output of the logic gate to a High level in the prior art structure shown in FIG. 10a. Therefore, by using a PMOS transistor with the gate grounded as an element for changing the output of the logic gate to a High level and further by using the above-described input gate in common, as shown in FIG. 10a, it is possible to greatly reduce the total input gate capacitance. Such a structure, however, is defective in that the time required for raising the potential at the output end of the circuit portion in common with the input gates is prolonged. Accordingly, in the present invention, in order to speed up the rise of the potential at the output end of the circuit portion in common with the input gate, a PMOS transistor with the drain connected to the output end of the common circuit portion is added, as shown in FIG. 10b.

Furthermore, if the number of the circuits which have the input gate in common is increased, a large load capacitance is connected to the output ends of the circuit portions which have the input gate in common, thereby prolonging the delay time of the logic gate at the (n+1)th stage. This is caused by the structure in which each of the circuit portions which have the input gate in common is constituted only by the MOS transistor. A logic gate of a composite circuit which is composed of a MOS transistor and a bipolar transistor is generally characterized in that the prolongation of the delay time due to the increase in the load capacitance is smaller than in the logic gate which is constituted only by the MOS transistor. Therefore, when a composite circuit which is composed of a MOS transistor and a bipolar transistor is used as the circuit portions (for example, block 17 in FIG. 5a) which have the input gate in common, it is possible to shorten the delay time of the logic gate at the (n+1)th stage and the delay time in the decoder circuit as a whole.

Additionally, it is another object of the present invention to provide a semiconductor memory which is capable of speeding up data writing into a memory cell and the recovery of the data lines.

To achieve this aim, another feature of the present invention is represented by a first embodiment of a semiconductor memory comprising: memory cells; a write line for writing data into a memory cell; a read line for reading data from a memory cell; data lines which are connected to the memory cells and which are connected to the read line through a first switch for closing the circuit at the time of reading data from a memory cell and opening the circuit at the time of writing data into a memory cell and connected to the write line through a second switch at the time of writing data; and a means for breaking the connection of the first switch which connects the data lines and the read line at the time of writing data.

Further, to achieve this aim, another feature of the present invention is represented by a second embodiment of a semiconductor memory comprising: memory cells; a write line for writing data into a memory cell; a read line for reading data from a memory cell; and data lines which are connected to the memory cells and which are connected to the read line through a first switch for closing the circuit at the time of reading data from a memory cell and at the time of writing data into a memory cell and a second switch for opening the circuit at the time of writing data into a memory cell and connected to the write line through a third switch for closing the circuit at the time of writing data into a memory cell.

Furthermore, to achieve this aim, a still another feature of the present invention is represented by a third embodiment of a semiconductor memory comprising: a memory cell array composed of memory cells arranged in a matrix; an address decoder for selecting a memory cell; a common write line for writing data into each of the memory cells; a common read line for reading data from each of the memory cells; means for connecting the data lines of the memory cell selected at the time of reading data from a memory cell to the common read line and breaking the connection between the data lines of the memory cell selected at the time of writing data into a memory cell and the common read line; and means for connecting the data lines of the memory cell selected at the time of writing data into a memory cell to the common write line.

A semiconductor integrated circuit such as a 1-chip CPU, a cache memory LSI and a controller IC is preferably provided therein with the first, second or third semiconductor memory. An information processor such as a computer is preferably provided with the first, second or third embodiment of a semiconductor memory as the memory.

According to the first embodiment of a semiconductor memory of the present invention, the first switch connects the data lines and the read line at the time of reading data from a memory cell, and breaks the connection at the time of writing data into a memory cell. The second switch connects the data lines with the write line at the time of writing data into a memory.

According to the second embodiment of a semiconductor memory of the present invention, the first switch closes the circuit at the time of reading data from a memory cell and at the time of writing data into a memory cell, and the second switch opens the circuit at the time of writing data into a memory cell. Therefore, the data lines and the read line are connected at the time of reading data form a memory cell. The third switch connects the data lines and the write line at the time of writing data into a memory cell.

According to the third embodiment of a semiconductor memory of the present invention, the data lines of the memory cell selected at the time of reading data from a memory cell are connected to the common read line and the connection between the data lines of the memory cell selected at the time of writing data into a memory cell and the common read line is broken. The data lines of the memory cell selected at the time of writing data into a memory are connected to the common write line.

As described above, according to the first, second and third embodiments of the memory semiconductor since the connection between the data lines and the common read line is broken at the time of data writing, the change in the potential of the common write line is not transmitted to the common read line which has a heavy load. That is, the common read line having a heavy load is disconnected from the data line at the time of writing, so that the potential does not change. The total capacitance of the load which is charged and discharged is therefore reduced at the time of the writing operation. In addition, since the potential of the common read line does not change at the time of recovery, only the data lines require recovery thereby resulting in the shortening of the recovery time.

A semiconductor circuit such as a 1-chip CPU and a cache memory LSI which is provided therein with the first, second or third embodiment of a semiconductor memory and an information processor, such as a computer, which is provided with the first, second or third embodiment of a semiconductor memory as the memory are capable of high-speed access of the memory and, hence of realizing a higher performance.

BRIEF DESCRIPTION OF THE DRAWINGS

FIGS. 3a and 3b show an embodiment of an improved decoder according to the present invention, wherein FIG. 3a is a circuit diagram thereof, and FIG. 3b is a logic diagram thereof;

FIGS. 4a and 4b are circuit diagrams of composite circuits of at least one MOS transistor and at least one bipolar transistor which can be substituted for CMOS circuits of FIG. 3a;

FIGS. 5a and 5b show another embodiment of a decoder of the present invention using a composite circuit, wherein FIG. 5a is a circuit diagram thereof, and FIG. 5b is a logic diagram thereof;

DETAILED DESCRIPTION OF THE PREFERRED EMBODIMENTS

Embodiments of the present invention will now be explained with reference to the accompanying drawings.

Figure 11:
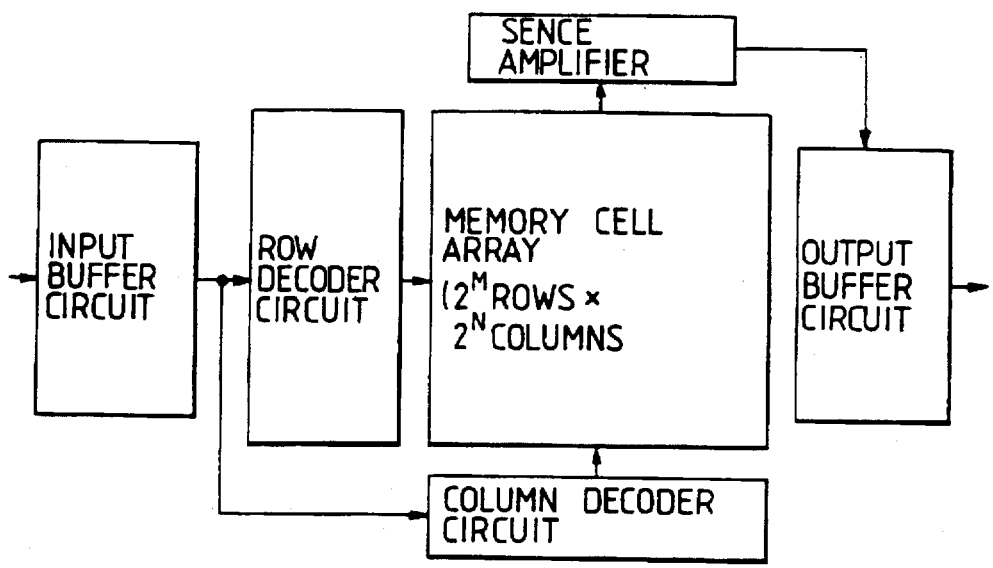
FIG. 11 is a block diagram of the overall structure of a semiconductor memory.

FIG. 11 is a block diagram of a semiconductor memory. A semiconductor memory is generally composed of an input buffer circuit, decoder circuits (a row decoder circuit and a column decoder circuit), a memory cell array, a sense amplifier and an output buffer circuit. In FIG. 11, the input buffer circuit receives an external input signal and outputs the signal to the decoder circuits. The row decoder circuit receives the signal from the input buffer circuit and supplies a row address to the memory cell array. The column decoder circuit receives the signal from the input buffer circuit and supplies a column address to the memory cell array. In the memory cell array, memory cells of $2^M$ rows×$2^N$ columns are arranged in a matrix. The sense amplifier amplifies the signal of the memory cell selected by the decoder circuits and transmits the amplified signal to the output buffer circuit. The output buffer circuit receives the signal from the sense amplifier and outputs the signal to the outside.

A semiconductor memory is required to have a large capacitance, to operate at a high speed and to consume low amounts of power. As to a large capacitance and a low power consumption, a CMOS memory constituted only by MOS transistors is the optimum, but since the speed of the CMOS memory is lower than a bipolar memory, the effort of speeding up the CMOS memory has been continued. The speed of a memory is defined by the delay time (access time) between the instant a signal is received by the input buffer circuit and the instant the signal is output from the output buffer circuit. To shorten the access time, it is necessary to speed up each of the input buffer circuits, the decoder circuit, the sense amplifier and the output buffer circuit. In a high-speed memory, the speeds of these circuits are from several nsec to several ten nsec, and the improvement of the speeds of the respective circuits leads to the improvement of the speed of the memory system as a whole. Especially, the improvement of the speed of the decoder circuit has a large effect on the improvement of the memory system as a whole, because it contributes to the speedup of the sense amplifier and the output buffer circuit at the subsequent stage as well as the speedup of the decoder circuit itself.

Figure 12:
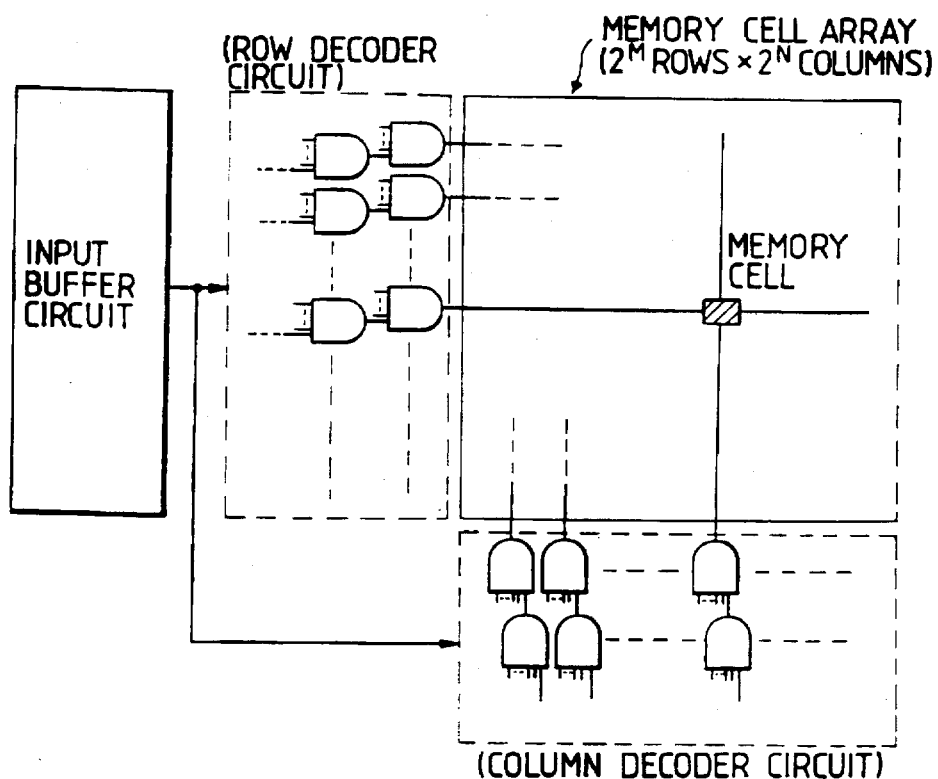
FIG. 12 is a block diagram showing the function of decoder circuits in selecting a predetermined memory cell.

Each of the row decoder circuit and the column decoder circuit has a structure in which a plurality of logic gates are arranged at a plurality of stages, as shown in FIG. 12. One row of memory cells are selected from the memory cells arranged in a matrix by the row decoder circuit, and one column of memory cells are selected by the column decoder circuit. Finally, the memory cell at the intersection of the selected row and column is selected, as shown in FIG. 12.

Figure 13A:
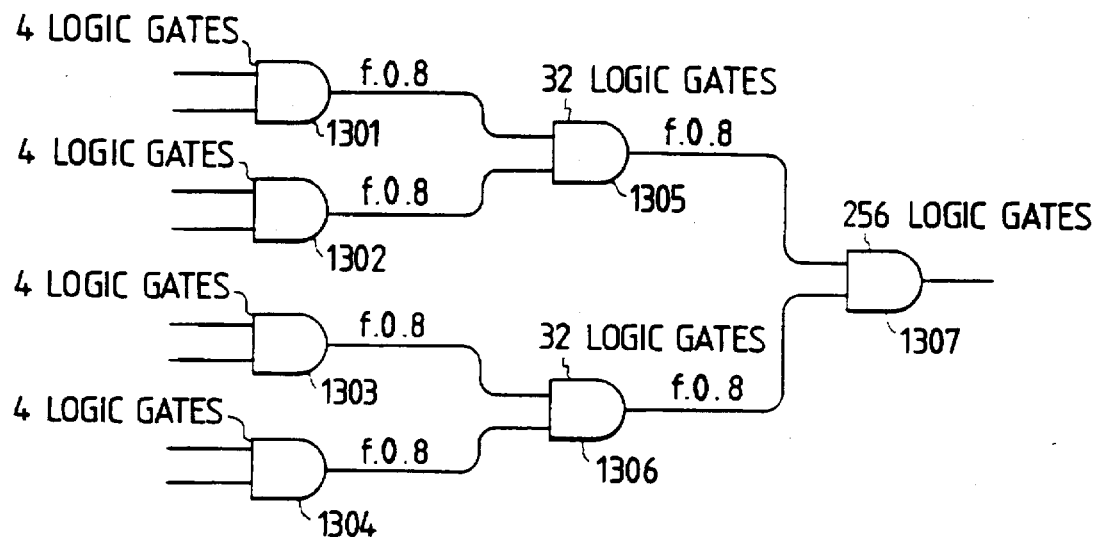
FIGS. 13a and 13b are logic diagrams of examples of simplified decoder circuits.
Figure 13B:
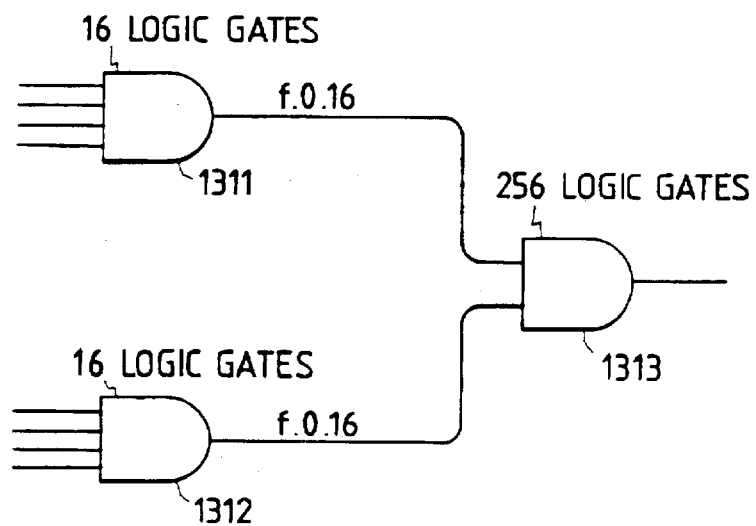

FIGS. 13 and 13b show examples of simplified decoder circuits, wherein FIG. 13a shows the decoder circuit in which the logic gates constituting the decoder circuit have a three-stage structure, and FIG. 13b shows the decoder circuit in which the logic gates constituting the decoder circuit have a two-stage structure.

In the case of the three-stage logic gate structure shown in FIG. 13a, logic gates 1301 to 1307 are two-input gates. Complementary input signals are input to the gates 1301, 1302, 1303 and 1304, and a signal is output from the gates 1307. The fan out (indicated by f.o. in FIG. 13a) of each of the logic gates 1301, 1302, 1303 and 1304 is 8 and the fan out of each of the logic gates 1305 and 1306 is also 8.

In the case of the two-state logic gate structure shown in FIG. 13b, logic gates 1311 and 1312 are four-input gates and a logic gate 1313 is a two-input gate. The fan out of each of the logic gates 1311 and 1312 is 16.

From FIGS. 13a and 13b, it is observed that when the number of stages of logic gates is reduced, the fan out of a logic gate increases.

Figure 14:
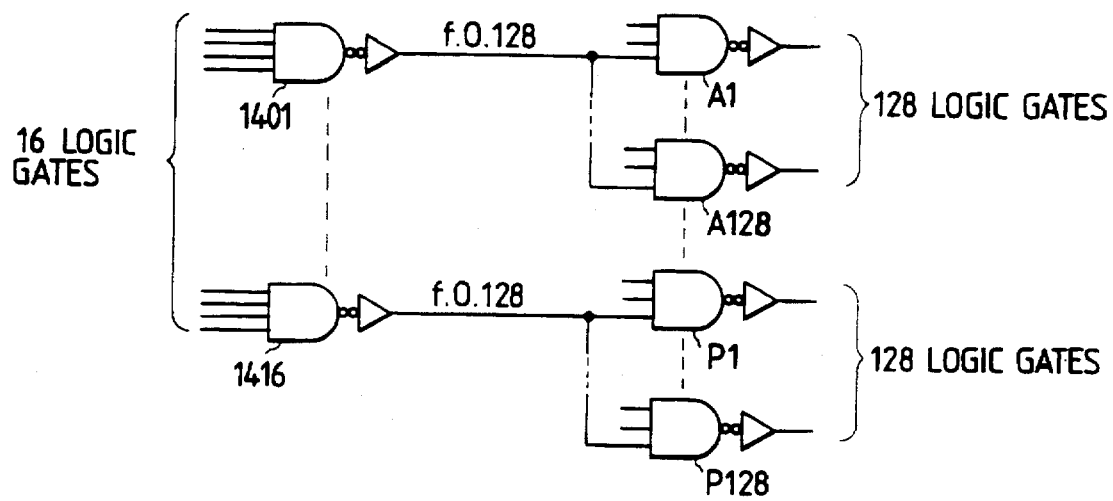
FIG. 14 is a logic circuit of an example of a row decoder circuit.

FIG. 14 is a logic diagram of an example of a row decoder circuit. The decoder circuit for selecting a high-integration memory cell is ordinarily composed of logic gates of three to 1 (wherein l is a natural number) stages. In this example, the logic gates have a two-stage structure in order to speed up the decoder circuit. This example is composed of three-input logic gates and four-input logic gates. When a signal is input to logic gates 1401 to 1416, one logic gate is selected from logic gates A1 to P128, and a row address is supplied to the memory cell array. In this case, the number of the fan outs of logic gates at the first stage is as large as 128.

Figure 16:
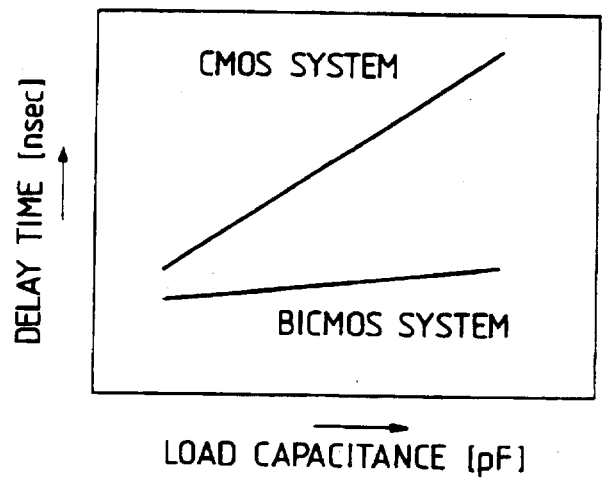
FIG. 16 shows the relationship between the output load capacitance and the delay time of a logic gate.
Figure 15:
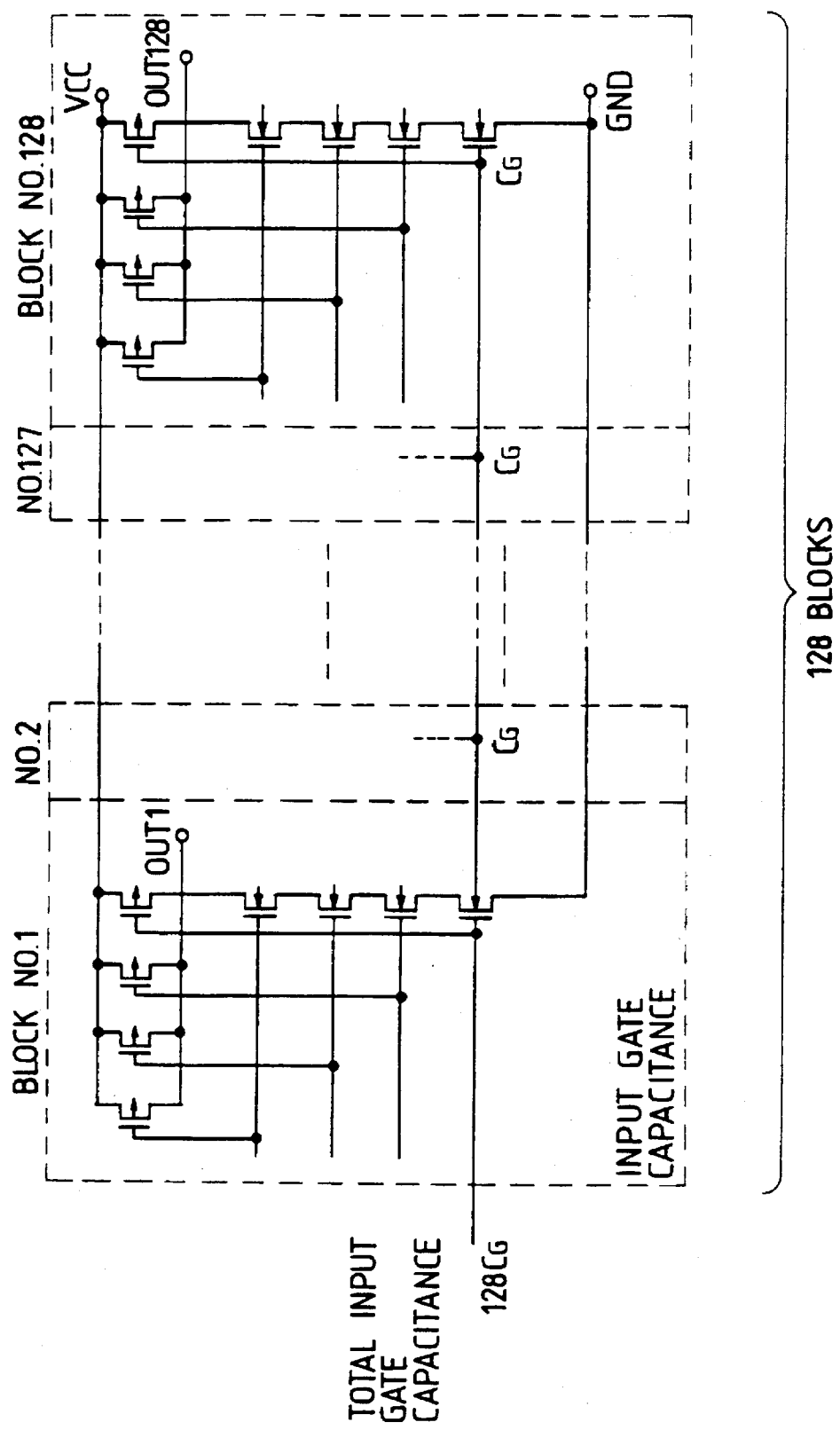
FIG. 15 is a circuit diagram of 128 logic gates which can be connected to the output ends of logic gates shown in FIG. 14.

FIG. 15 is a circuit diagram of a conventional 128 logic gate structure which is connected to the output end of the logic gate 1401 shown in FIG. 14. If the gate input capacitance per stage is $C_G$, then $C_G$ is the sum of the gate capacitances of the PMOS transistors and the NMOS transistors, as represented by the equation (2), and the total gate capacitance connected to the output end of the logic gate 1401 is $128 \times C_G$. Since the relationship between the output load capacitance of the logic gate and the delay time is proportional, as shown in FIG. 16, when the output load capacitance increases, the delay time inconveniently is prolonged.

In the conventional logic gates shown in FIG. 15, the fan out of the logic gate at the first stage is assumed to be 128, but this is only an example. With the increase in the capacitance of the memory cell expected in the future development, the fan out inevitably increases. This is a serious obstacle to the speedup of the decoder circuit.

Figure 3A:
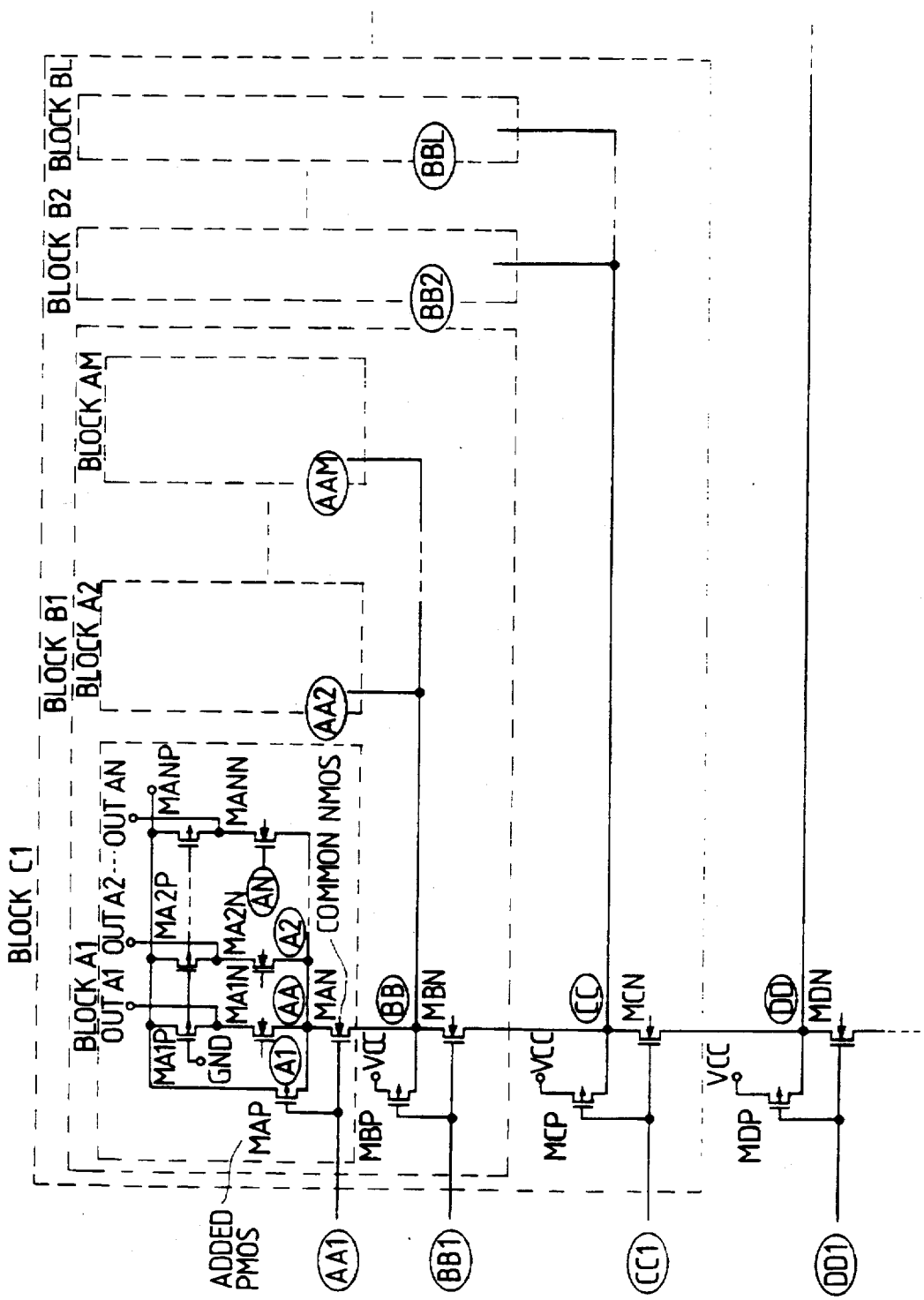
Figure 3B:
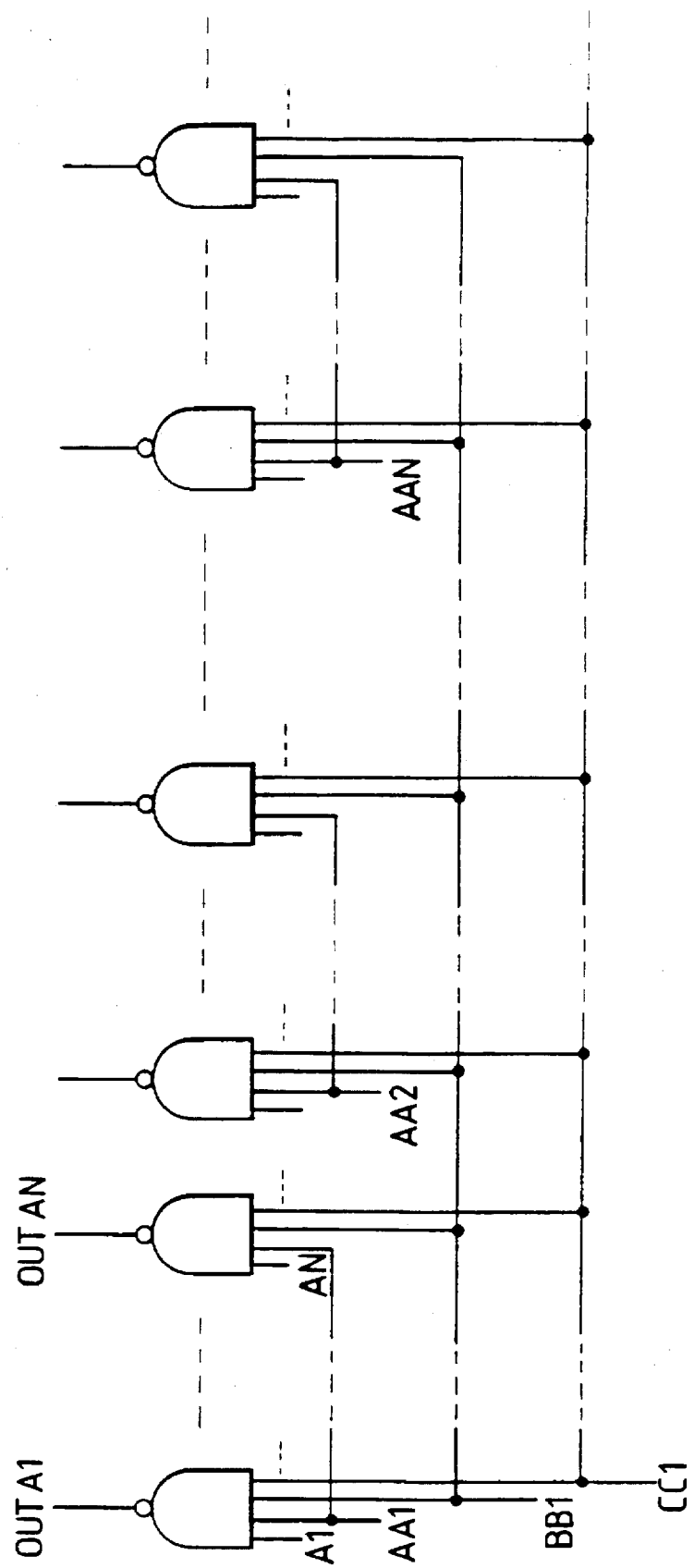

An embodiment of an improved decoder of a semiconductor integrated circuit according to the present invention for solving this problem will be explained with reference to FIGS. 3a and 3b. FIG. 3a is a circuit diagram of an example of logic gates in accordance with the present invention, and FIG. 3b is a logic diagram of the circuit diagram shown in FIG. 3a, showing the arrangement of a plurality of NAND gates each having a plurality of input gates.

In FIG. 3a, the symbols MA1P to MANP represent first PMOS load transistors, MA1N to MANN represent first NMOS transistors, and the drains of the first PMOS load transistors and the first NMOS transistors are respectively connected to output ends of OUTA1 to OUTAN for a plurality of gates in the block A1. The drain of a second PMOS transistor MAP, with the input AA1 connected to the gate thereof, and the drain of a second NMOS transistor MAN are commonly connected to N (where N is a natural number) sources (node AA) of the first NMOS transistors MA1N to MANN. As is clear from FIG. 3b, the input AA1 is in common with the N NAND gates of the block A1. This input AA1 is coupled to the gates of the second PMOS MAP and the second NMOS MAN, which are both common to all of the gates of block A1. As discussed earlier, the use of the added second common PMOS (MAP) in conjunction with the second NMOS (MAN) operates to greatly improve the operation speed.

If it is assumed that MA1P to MANP, MA1N to MANN, MAP and MAN constitute block A1, then blocks A2 to AM have the same structure as the block A1. These M (where M is a natural number) blocks are connected to the drains (node BB) of a PMOS transistor MBP and a NMOS transistor MBN. If it is assumed that the blocks A1 to AM, together with MBP and MBN constitute block BL, then the blocks B2 to B1 have the same structure as the block B1. In this way, a plurality of blocks are composed to form an overall block C1 shown by the outer dashed lines in FIG. 3a.

In the above-described structure in which a plurality of NAND gates have an input gate in common (for example, AA1 for block A1), the capacitance of the input gate is greatly reduced in comparison with that in a conventional structure which has been generally used and which does not have an input gate used in common. Consequently, the output load capacitance of the logic gates connected top the preceding stage is reduced, and the delay time at the logic gate is shortened. Since a logic gate is ordinarily composed of a plurality of logic gates connected in series, the delay time in a logic gate group as a whole is shortened. Since the principle of the operation of the circuit shown in FIG. 3a is the same as that of the circuit shown in FIG. 5a which will be described later, explanation thereof will be omitted.

In the embodiment shown in FIG. 3a, L, M and N are any given natural numbers showing the number of blocks. However, if L, M and N are too large, a large capacitance is connected to the nodes AA, BB, CC, . . . . In this case, signals to the input AA1, BB1, CC1, . . . change and the delay time required when potentials of the OUTA1, . . . change is also greatly prolonged. This is due to the use of CMOS inverters composed of MAP and MAN, MBP and MBN, . . . for changing the potentials of the nodes AA, BB, CC . . . respectively.

Figure 4B:
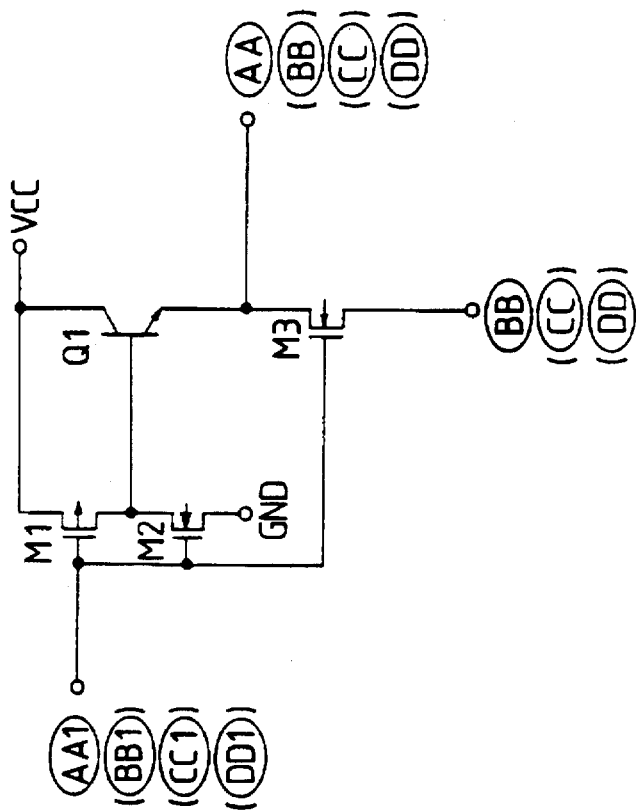
Figure 4A:
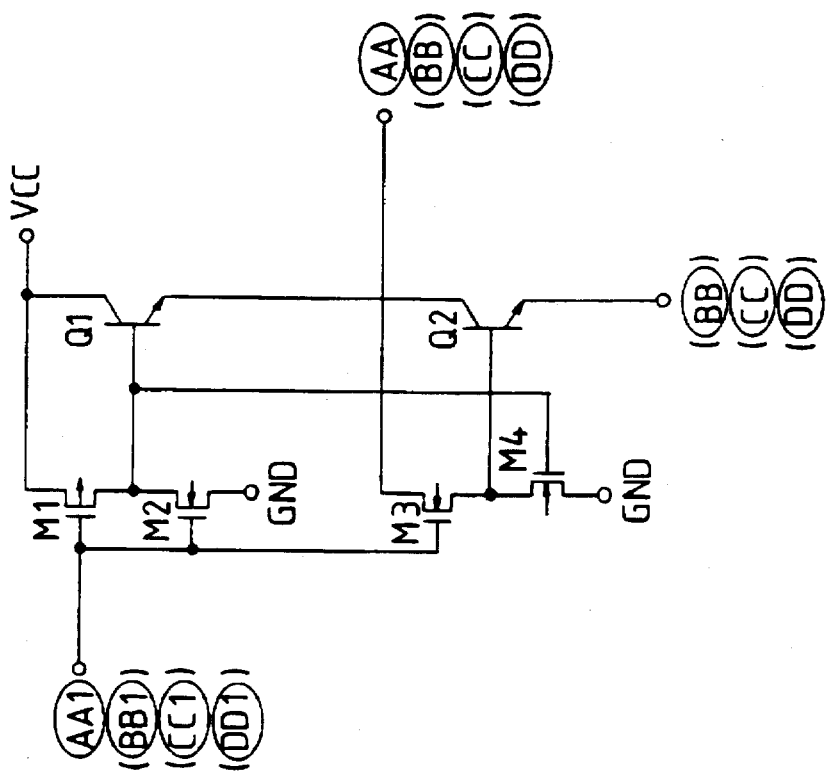

On the other hand, a BiCMOS inverter which is a composite circuit of a MOS transistor and a bipolar transistor is characterized in that the prolongation of the delay time with respect to the increase in the output load capacitance is smaller than in a CMOS inverter, as shown in FIG. 16. Therefore, if a composite circuit of a MOS transistor and a bipolar transistor shown in FIGS. 4a and 4b are used as the CMOS inverter circuit portion composed of MAP and MAN, MBP and MBN, . . . , even if the values of L, M and N are increased, it is possible to constitute a logic gate having a relatively short delay time.

Figure 5B:
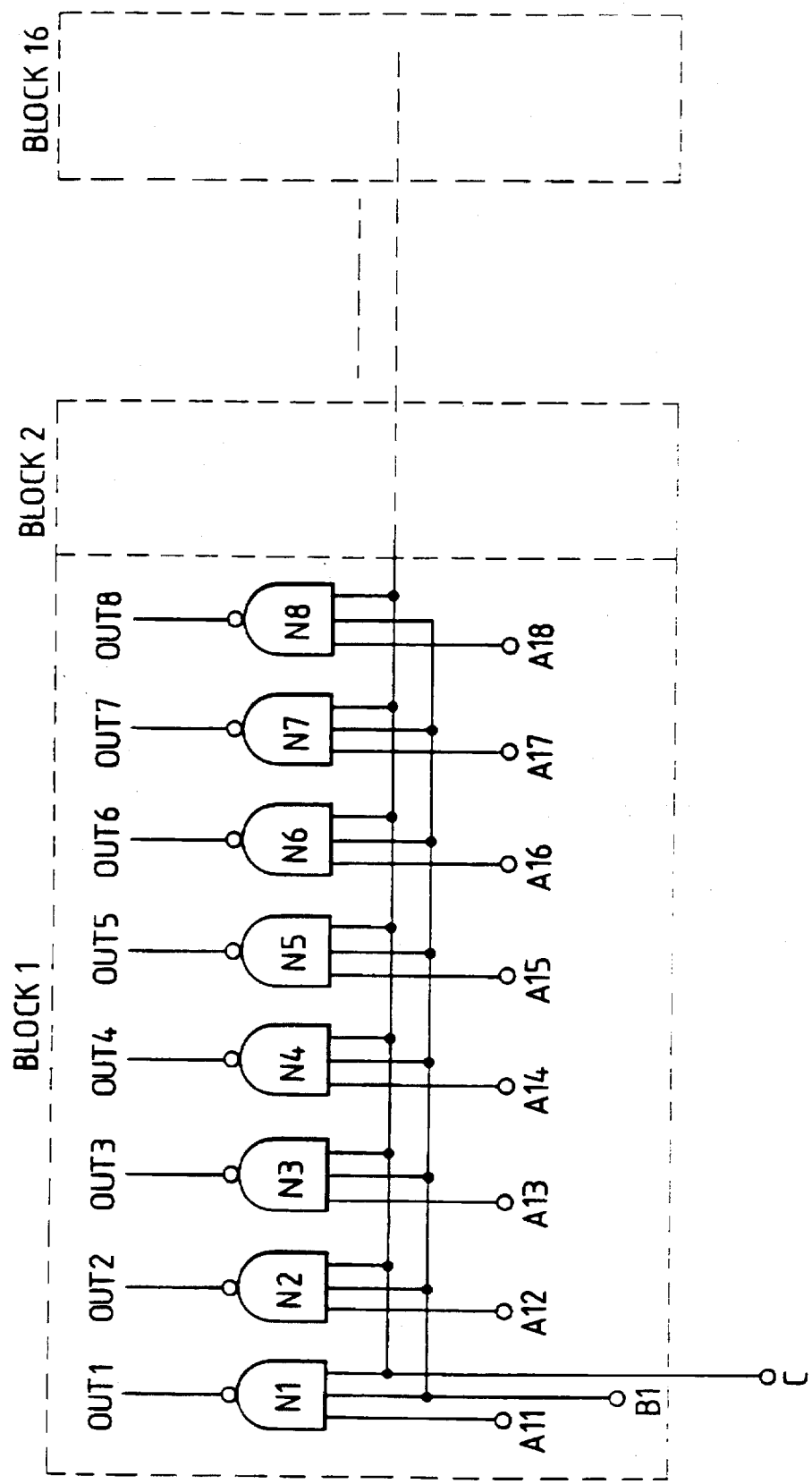

FIG. 5a is a circuit diagram of another embodiment of an improved decoder of the present invention. FIG. 5b is a logic diagram of the circuit diagram shown in FIG. 5a. In FIG. 5a, the symbols MA1 to MA8 in the block 1 represents first PMOS load transistors, MA9 to MA16 represent first NMOS transistors, MB1 represents the added second PMOS transistor and MB2 represents a common second NMOS transistor. The blocks 2 to 16 have the same structure as the block 1 and are connected to a node ①. The block 17 is a common gate input circuit portion and is a composite circuit of MOS transistors and a bipolar transistor. MC1 in the block 17 represents a PMOS transistor, MC2 and MC3 represent NMOS transistors, and QC1 represents an npn junction bipolar transistor.

As is clear from FIGS. 5a and 5b, the block 1 includes 8 three-input NAND gates. There are 15 more blocks (blocks 2 to 16) having the same structure as the block 1, so that the total number of NAND gates is 8×16=128. One of the three inputs of a NAND gate is in common with the 128 NAND gates. The eight common input nodes are represented as B1 to B16.

In the decoder circuit having this logic gate structure, the fan out of the logic gate at the preceding stage is 128, which is the same as that in the examples shown in FIGS. 13 and 14. However, since the total input capacitance is $1 \times C_G$ and the delay time of the logic gate at the preceding stage is shortened, the speedup of the decoder circuit is realized.

In the embodiment shown in FIGS. 5a and 5b, the number of common input gates is 128, but this is only an example. Although this circuit has the above-described merits, the operation is more complicated than that of the conventional example shown in FIG. 15.

The operation of the circuit shown in FIG. 5a will now be explained. Since the operation of the blocks 2 to 16 is the same as that of the block 1, only the operation of the block 1 will be explained in the following.

In the block 1, since the gates of the first PMOS load transistors MA1 to MA8 are grounded, the PMOS transistors MA1 to MA8 are constantly in the ON state and act as resistors. A second PMOS transistor MB1 and a second NMOS transistor MB2 constitute a CMOS inverter with respect to the input B1, and the common output ② of MB1 and MB2 is connected in common to the sources of the 8 first NMOS transistors MA9 to MA16. The block 17 includes an inverter circuit composed of a composite circuit of MOS transistors and a bipolar transistor, and the inverter signal of the input c is output to the node ①. Additionally, even if a CMOS inverter circuit composed of a PMOS and NMOS transistors is used as the inverter circuit in the block 17, the operation of the circuit is possible. However, since 128 junction capacitances are connected to the output node ① of the block 17 and the load capacitance is very large, the delay time of the block 17 becomes extremely long when a signal is input to the other input gates. In this point, a BiCMOS system in this embodiment is more advantageous.

There are 8 logic states in a three-input NAND gate. Only when all three inputs are at a High level is the output at a Low level. In the other cases, the outputs are at a High level. The respective cases will be described in the following.

The first and second PMOS transistors MA1 and MB1 and the first and second NMOS transistors MA9 and MB2 in the block 1, together with the block 17, constitute one NAND gate N1. In this case, if the potentials of the input nodes A11, B1 and C are at a High level, the first NMOS transistor MA9 is in the ON state, the second PMOS transistor MB1 is in the OFF state, and the second NMOS transistor MB2 is in the ON state. On the other hand, the PMOS transistor MC1 and the NMOS transistor MC2 in the block 17 constitute a CMOS inverter. Since the PMOS transistor MC1 is in the OFF state and the NMOS transistor MC2 is in the ON state, the output of the CMOS inverter, namely, the potential at the base C1 of the bipolar transistor QC1 is in the OFF state. The NMOS transistor MC3 is in the ON state. In this way, the current from the first PMOS load transistor MA1 which is constantly in the ON state flows the ground through the NMOS transistors MA9, MB2 and MC3. The potential of the output OUT1 is determined by the resistance ratio of the PMOS transistor MA1, and the NMOS transistors MA9, MB2 and MC3, and the OUT1 is at a Low level.

When the potentials of the nodes A11 and B1 are at a High level and only the potential of the node C is at a Low level, since the PMOS transistor MC1 is in the ON state and the NMOS transistor MC2 is in the OFF state, the node C1 is at a High level, so that the bipolar transistor QC1 is in the ON state. Since the NMOS transistor MC3 is in the OFF state, the node ① is at a High level. As a result, the gate source potential of the NMOS transistor MB2 which is in the ON state becomes not more than the threshold voltage $V_{th}$ of an NMOS transistor, so that the NMOS transistor MB2 turns to th OFF state and the output OUT1 is at a High level.

When the nodes A11 and C are at a High level and the node B1 is at a Low level, the principle is the same as the above case. In this case, since B1 is at a Low level, the PMOS transistor MB1 is in the ON state and the NMOS transistor MB2 is in the OFF state. Therefore, the node ② is at a High level, so that the output OUT1 is at a High level.

Since the other cases in which the output OUT1 is at a High level have the same principle as the above cases, explanation thereof will be omitted.

Figure 6A:
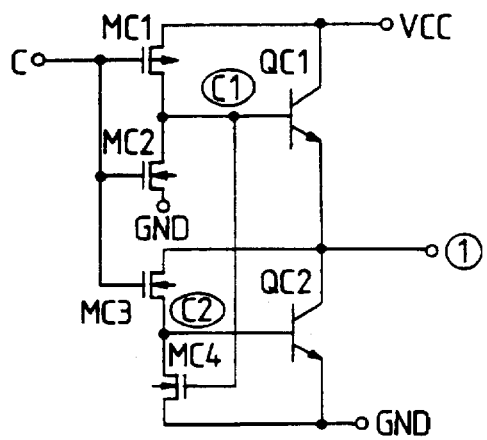
FIGS. 6a, 6c and 6d are circuit diagrams of composite circuits of MOS transistors and one or more bipolar transistors

In the embodiment shown in FIGS. 5a and 5b, the block 17 which is an input portion in common with the 128 NAND gates is a composite circuit of MOS transistors and a bipolar transistor, and the NMOS transistor MC3 is used as the element for breaking the potential of the node ① at the output end of the composite circuit. However, the same operation is possible by changing this portion into a circuit such as shown in FIG. 6a which uses a bipolar transistor. On the other hand, the use of this circuit has a drawback in that when the inputs A11 and B1 are at a High level and C changes from a High level to a Low level and the output OUT1 from a Low level to a High level, a large delay time is required.

Figure 6B:
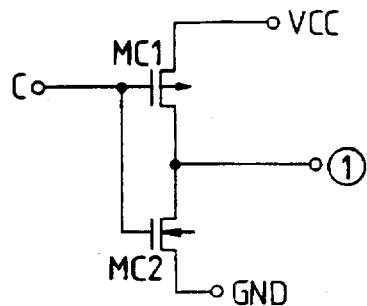
FIG. 6b shows a circuit diagram of an MOS-only circuit which can be substituted for a part of the embodiment shown in FIGS. 5a and 5b.

The block 17 may also be composed only of the NMOS transistors shown in FIG. 6b. However, when the load capacitance such as the junction capacitance and the line capacitance of the NMOS transistor is large, the delay time at the output ① required when only the potential of the input C changes is prolonged.

Figure 6C:
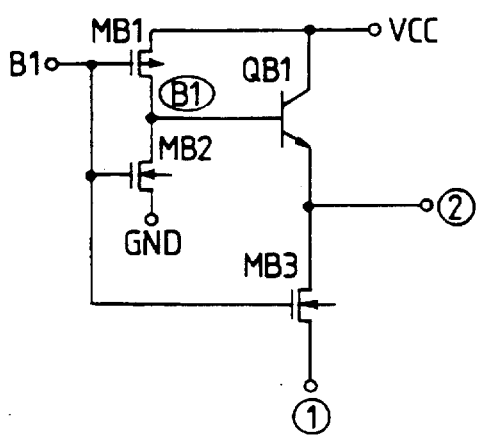
Figure 6D:
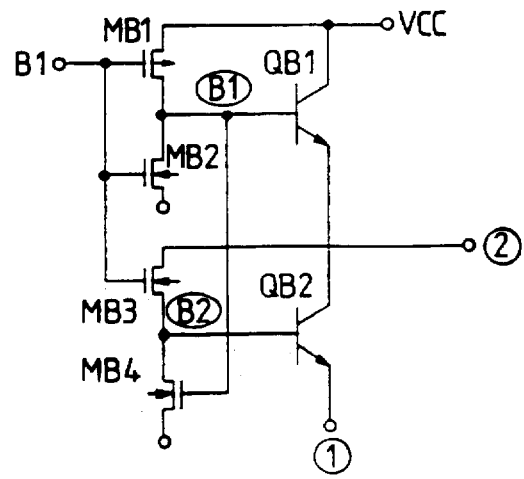

Furthermore, it is possible to change the CMOS inverter portion composed of the PMOS transistor MB1 which is an input portion in common with the 8 PMOS transistors and the NMOS transistor MB2 into an inverter circuit composed of a composite circuit of a MOS transistor and a bipolar transistor, as shown in FIG. 6c.

FIGS. 5a and 5b represent 128 NAND gates and in the logical structure in this case, 1 NAND gate is selected from the 128 NAND gates. For this reason, even if a PMOS transistor, the gate of which is grounded and which is constantly in the ON state, is used as the element which changes the output potential to a High level, there is no problem in the consumption of power. However, when a plurality of NAND gates are simultaneously selected, the power consumption matters. For example, when 8 NAND gates are simultaneously selected from a plurality of NAND gates, a steady-state current from the PMOS transistor, the gate of which is grounded and which is constantly in the ON state, is 8 times as large as the current from the logic gate, and 8 times as large a power is consumed. It is therefore preferable not to use a PMOS transistor, the gate of which is grounded and which is constantly in the ON state, as the element which changes the output potential to a High level.

Figure 7:
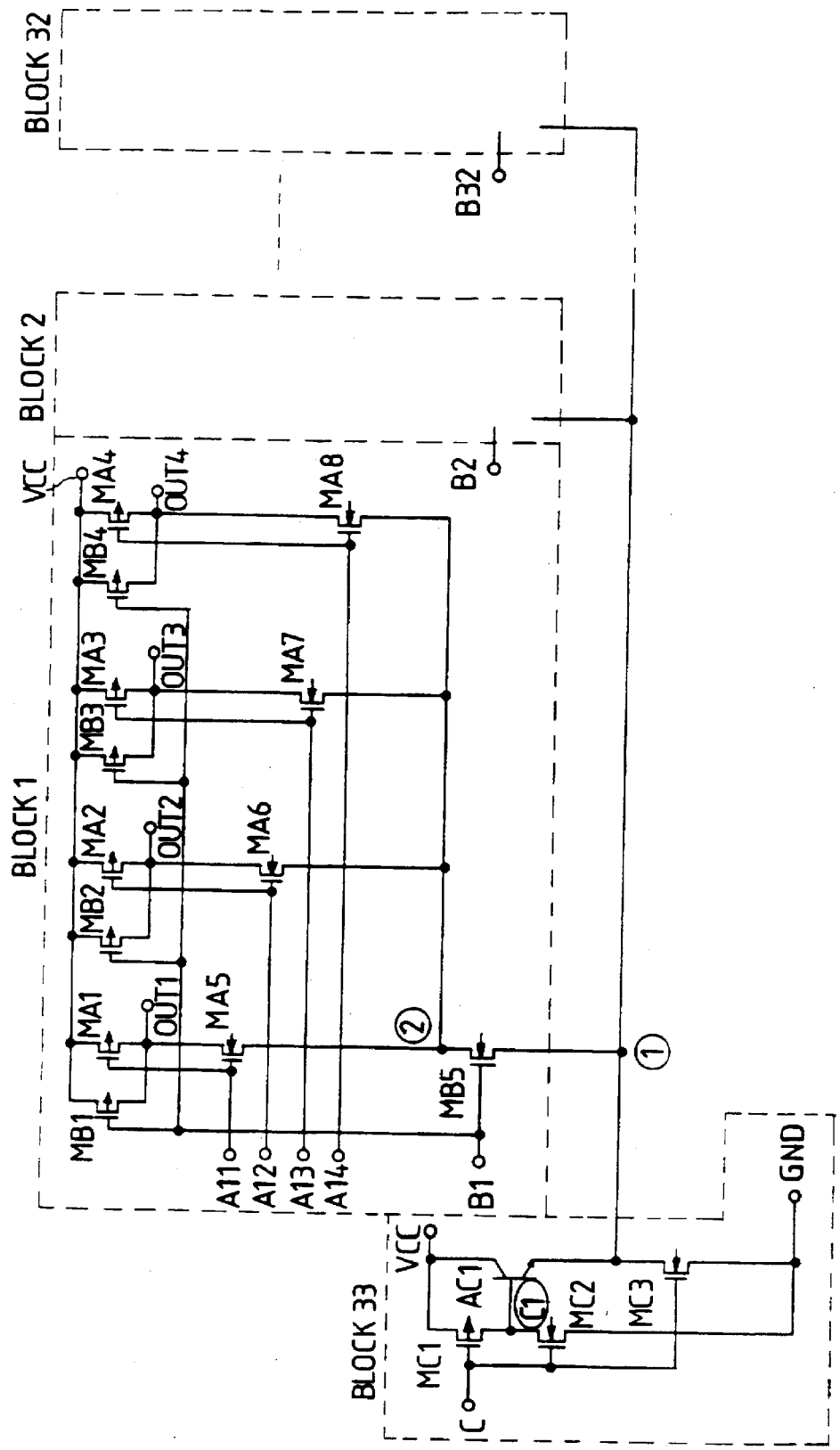
FIG. 7 is a circuit diagram of an embodiment which does not use a PMOS transistor, the gate of which is grounded and which is constantly in the ON state, as the element which changes the output potential to a High level.
Figure 8A:
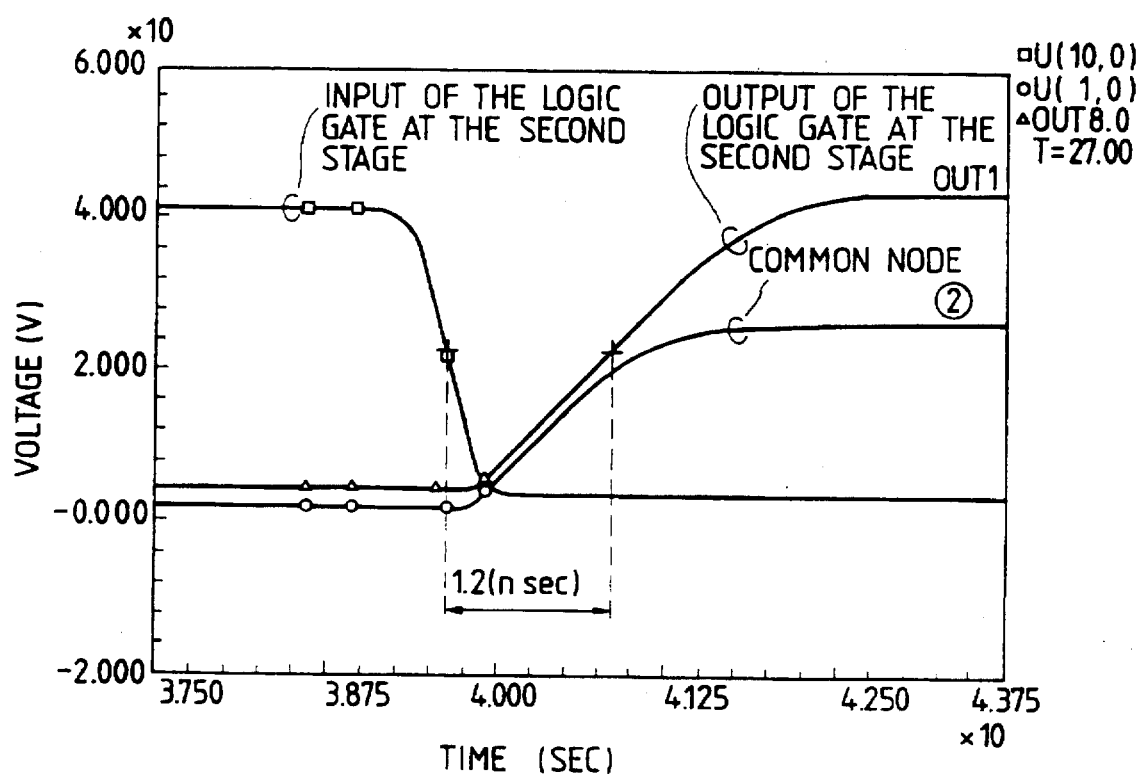
FIGS. 8a and 8b show the waveforms of simulation which show the operational delay time shortening effect achieved by adding a PMOS transistor.
Figure 8B:
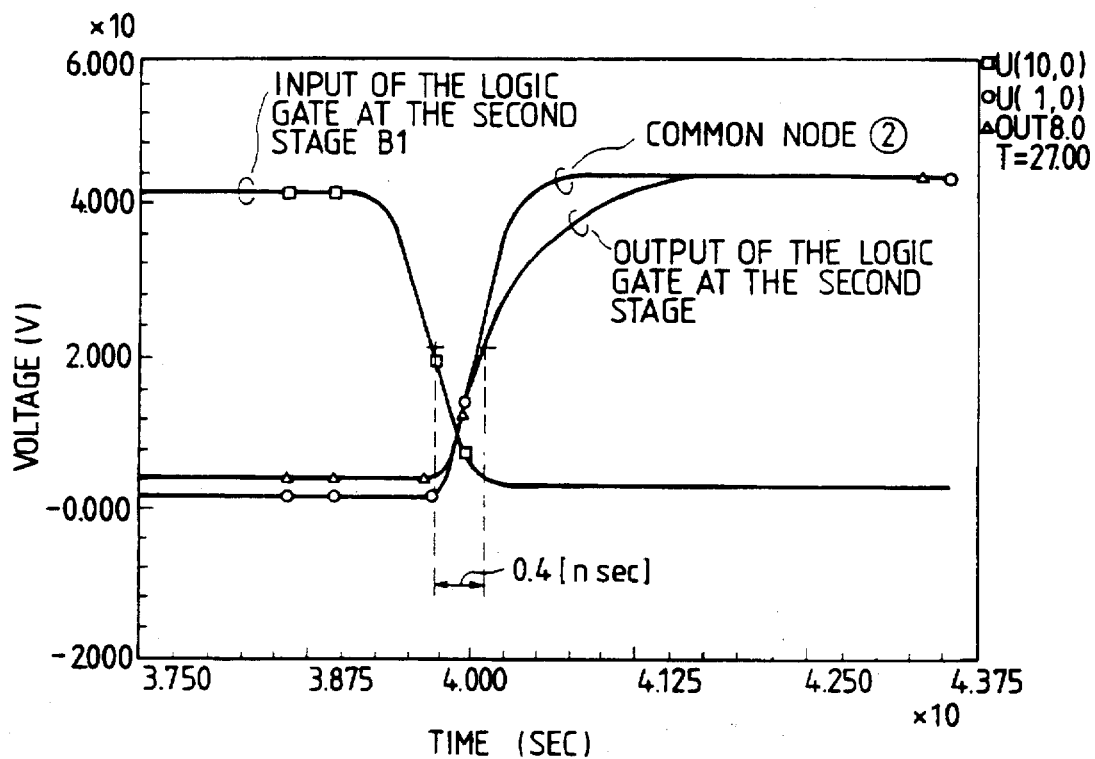
Figure 9:
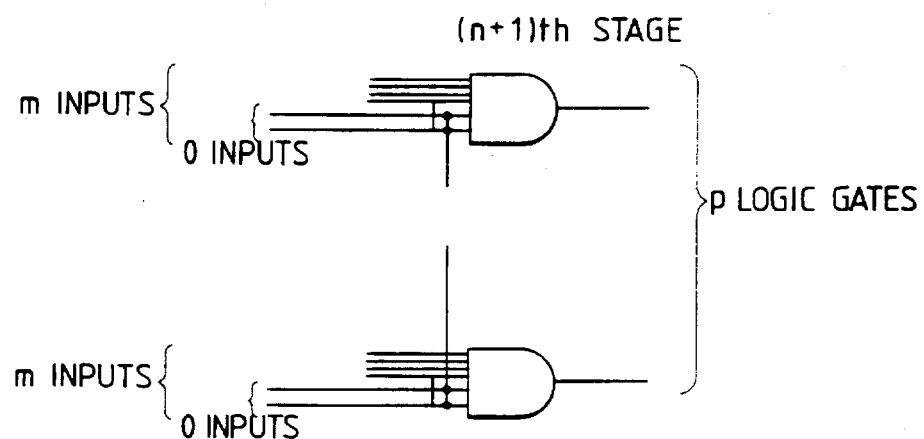
FIG. 9 is a logic diagram of an example of a decoder circuit with common inputs.
Figure 10A:
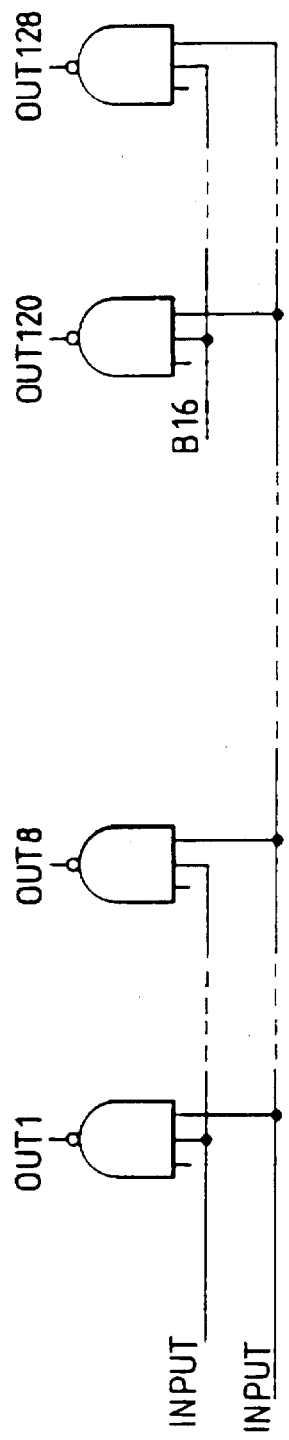
FIG. 10a shows a logic diagram and a circuit diagram of a conventional decoder circuit.
Figure 10A:
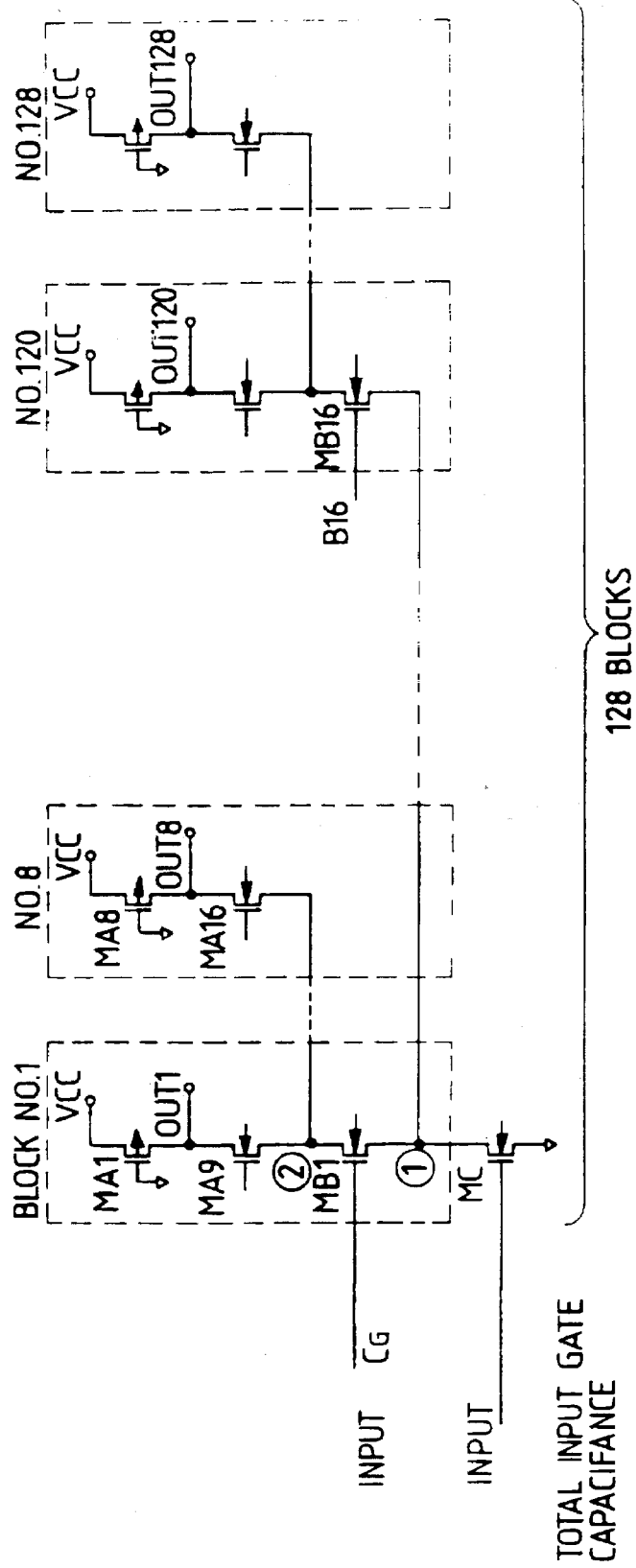
Figure 10B:
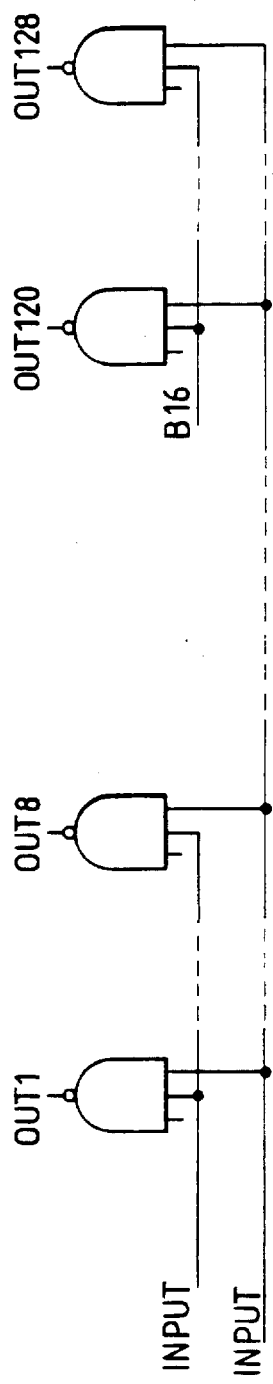
FIG. 10b is a logic diagram and a circuit diagram of another decoder embodiment of the present invention.
Figure 10B:
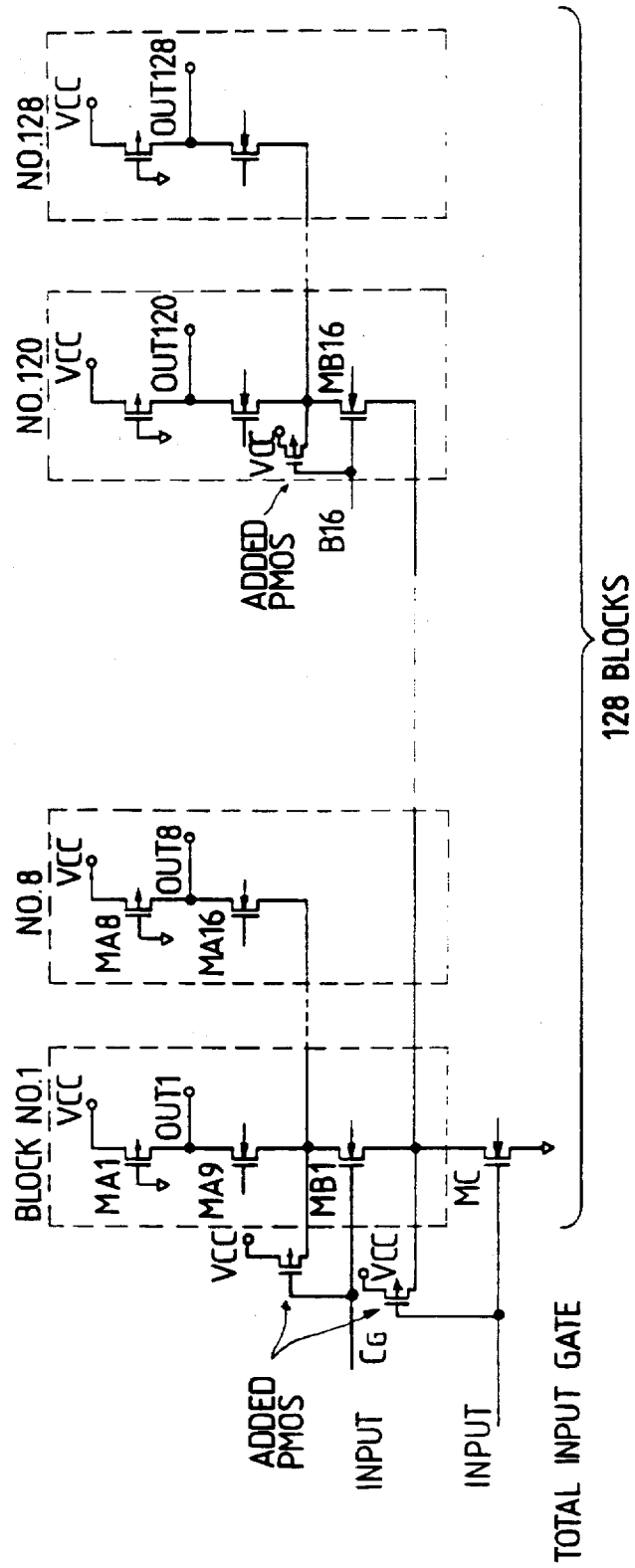

FIG. 7 shows a logic gate having the logic structure in which 8 NAND gates are selected from 128 NAND gates. The fundamental structure is the same as in the embodiment shown in FIGS. 5a and 5b except that the grounded gate PMOS load transistor arrangement is not used. More specifically, in FIG. 5a, the PMOS load transistors MA1 to MA8 each have a gate which is grounded so that the PMOS load transistors are constantly in the ON state to change the output potential to a High level. Instead, in FIG. 7 (which shows 4 gate blocks instead of 8 gate blocks), the PMOS load transistors MA1 to MA4 have their gates respectively coupled to receive the same input signal as the corresponding NMOS transistors MA5 to MA8 that they are connected to. Also, in FIG. 7, instead of providing a single common second PMOS transistor such as MB1 of FIG. 5a for logic gates of the block B1, the structure of FIG. 7 uses a separate PMOS MB1 to MB4 for each of the logic gates of the block B1. Blocks B2 to B32 would be similarly constructed. As a result, the power consumption is approximately equal to the circuit in which 1 NAND gate is selected.

Since the operation of the circuit shown in FIG. 7 is the same as that of the embodiment shown in FIGS. 5a and 5b, explanation thereof will be omitted.

Although the number of NAND gates which have an input gate in common is set at 8 and 4 in the embodiments shown in FIGS. 5a and 7, respectively, this is only an example and the number is not specified.

These embodiments are used for a decoder circuit of a semiconductor memory, but the present invention is not restricted to a decoder circuit, and is applicable to all semiconductor integrated circuits in which a plurality of logic gates are arranged and the logical relationship of a multiplicity of input signals is necessary.

According to the above-described aspects of the present invention, it is possible to obtain a semiconductor integrated circuit including a decoder circuit in which the input capacitance is small in spite of a large fan out, and which is capable of high-speed operation.

Figure 17:
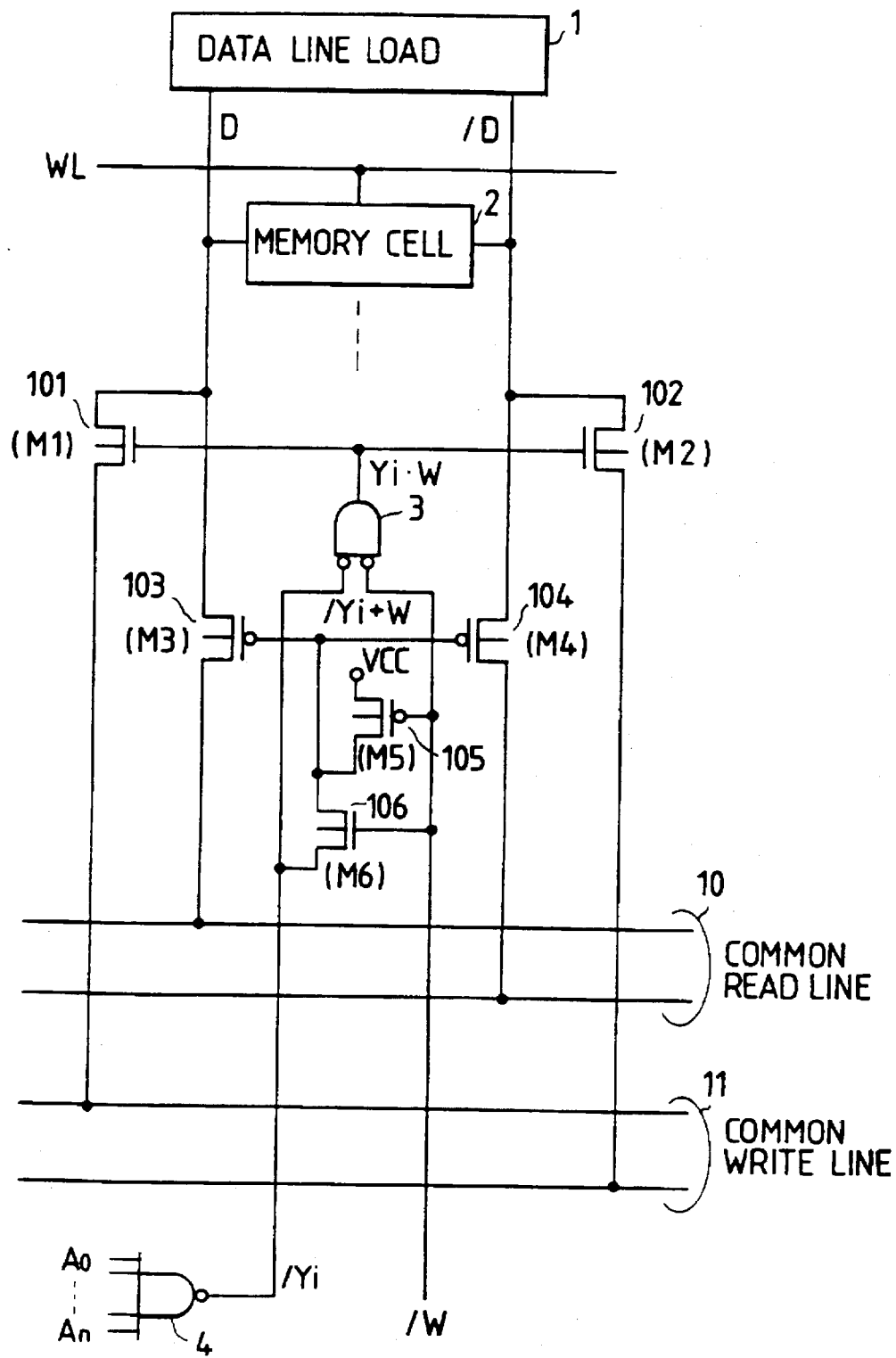
FIG. 17 is a circuit diagram showing the structure of the data reading circuit and the data writing of an embodiment of a semiconductor memory according to the present invention.

FIG. 17 shows the structure of the data reading circuit and the data writing circuit of an embodiment of a semiconductor memory according to another aspect of the present invention.

In FIG. 17, the reference numeral 1 represents a data line load circuit, the symbols D, /D represent a pair of data lines (or pair of complementary data lines), WL a word line, the reference numeral 2 represents a memory cell, 101 (M1) and 102 (M2) represent writing transfer gates, 103 (M3) and 104 (M4) represent reading transfer gates, numeral 3 represents a two-input NOR gate inputting a column select signal /Yi and a writing control signal /W, and the symbol VCC represents a supply voltage.

The reference numeral 105 (M5) represents a pull-up MOS for raising the gate voltages of the reading transfer gates 103 (M3) and 104 (M4) to a High level when the writing control signal /W is Low, and 106 (M6) represents a transfer gate for transmitting the column select signal /Yi to the gates 103 (M3) and 104 (M4) when the write control signal /W is High. Numeral 4 represents a decoder circuit for generating the column select signal /Yi on the basis of addresses $A_0$ to $A_n$, numeral 10 represents a pair of common read lines for reading the data out of the memory cell, and numeral 11 represents a pair of common write lines for writing data into the memory cell. To the common read lines 10 and the common write lines 11, data lines of a plurality of different columns (not shown) are connected through the reading transfer gates 103 (M3) and 104 (M4) and the writing transfer gates 101 (M1) and 102 (M2).

The operation of this embodiment will be explained in the following.

The operation of reading the data from the memory cell is carried out by raising the word line WL so as to read the data held by the memory cell 2 in the form of a potential difference produced on a pair of data lines D, /D. In this case, since the process is in a reading cycle, the writing control signal /W is High and the column select signal /Yi is Low because it has been selected. Therefore, the output of the two-input NOR gate 3 is Low and the writing transfer gates 101 (M1) and 102 (M2) are turned OFF.

Since the transfer gate M6 is ON, the column select signal /Yi is transmitted to the gates 103 (M3) and 104 (M4) through the transfer gate M6 and the reading transfer gates 103 (M3) and 104 (M4) are turned ON. Consequently, the potential difference produced on the pair of data lines D, /D is transmitted to the common read lines 10 and read out.

On the other hand, at the time of a data writing operation, since both the writing control signal /W and the column select signal /Yi are Low, the output of the two-input NOR gate 3 is High, and the writing transfer gates 101 (M1) and 102 (M2) are turned ON. In accordance with the writing control signal /W, the transfer gate 106 (M6) is turned OFF and the pull-up MOS 105 (M5) is turned ON, so that the reading transfer gates 103 (M3) and 104 (M4), with the gate voltages pulled up, are turned OFF. Therefore, the data written on the common write line 11 is transmitted to the pair of data lines D, /D through the writing transfer gates 101 (M1) and 102 (M2) and written into the memory cell 2.

Figure 1:
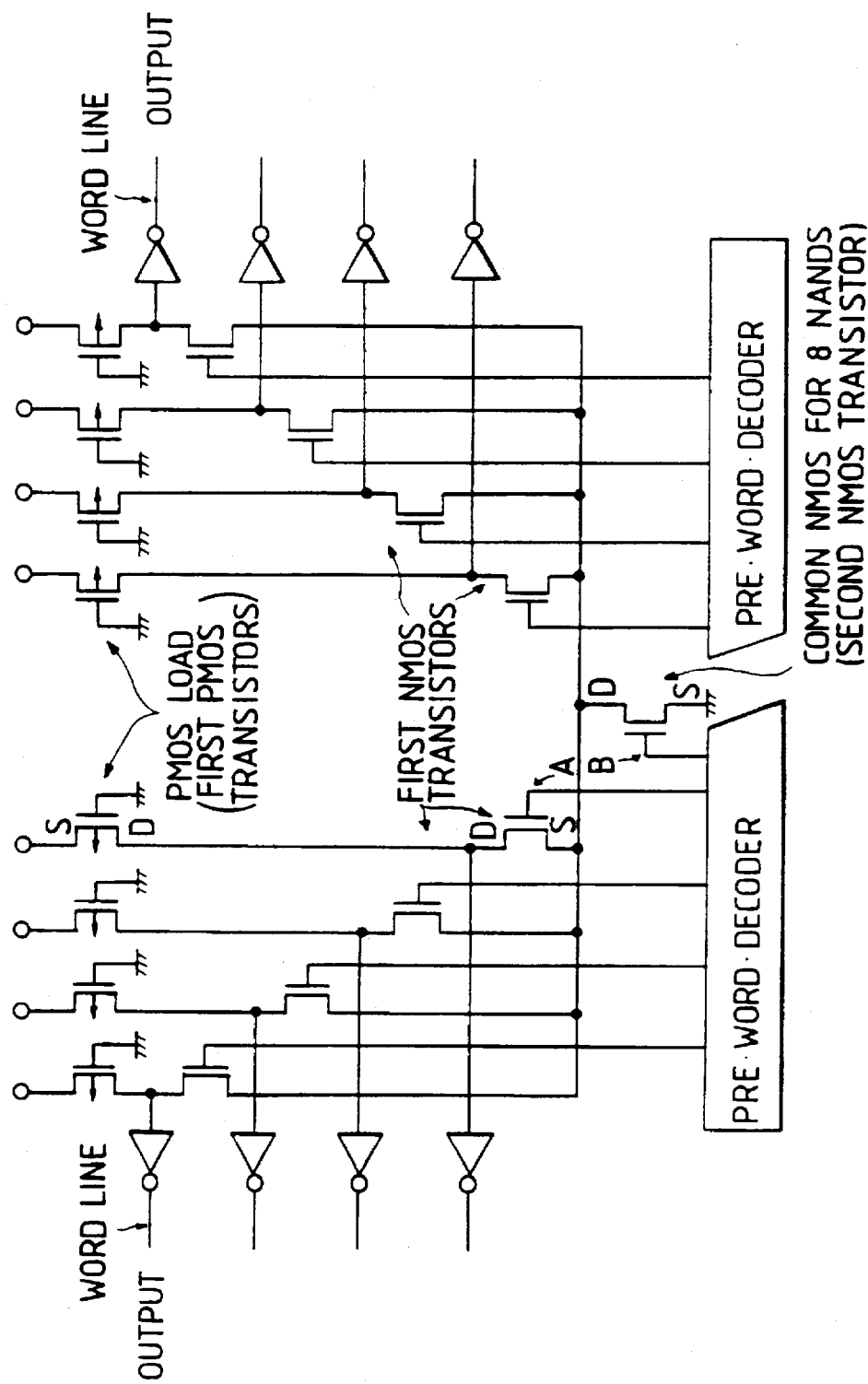
FIG. 1 is a circuit diagram of an example of a conventional decoder circuit.
Figure 2:
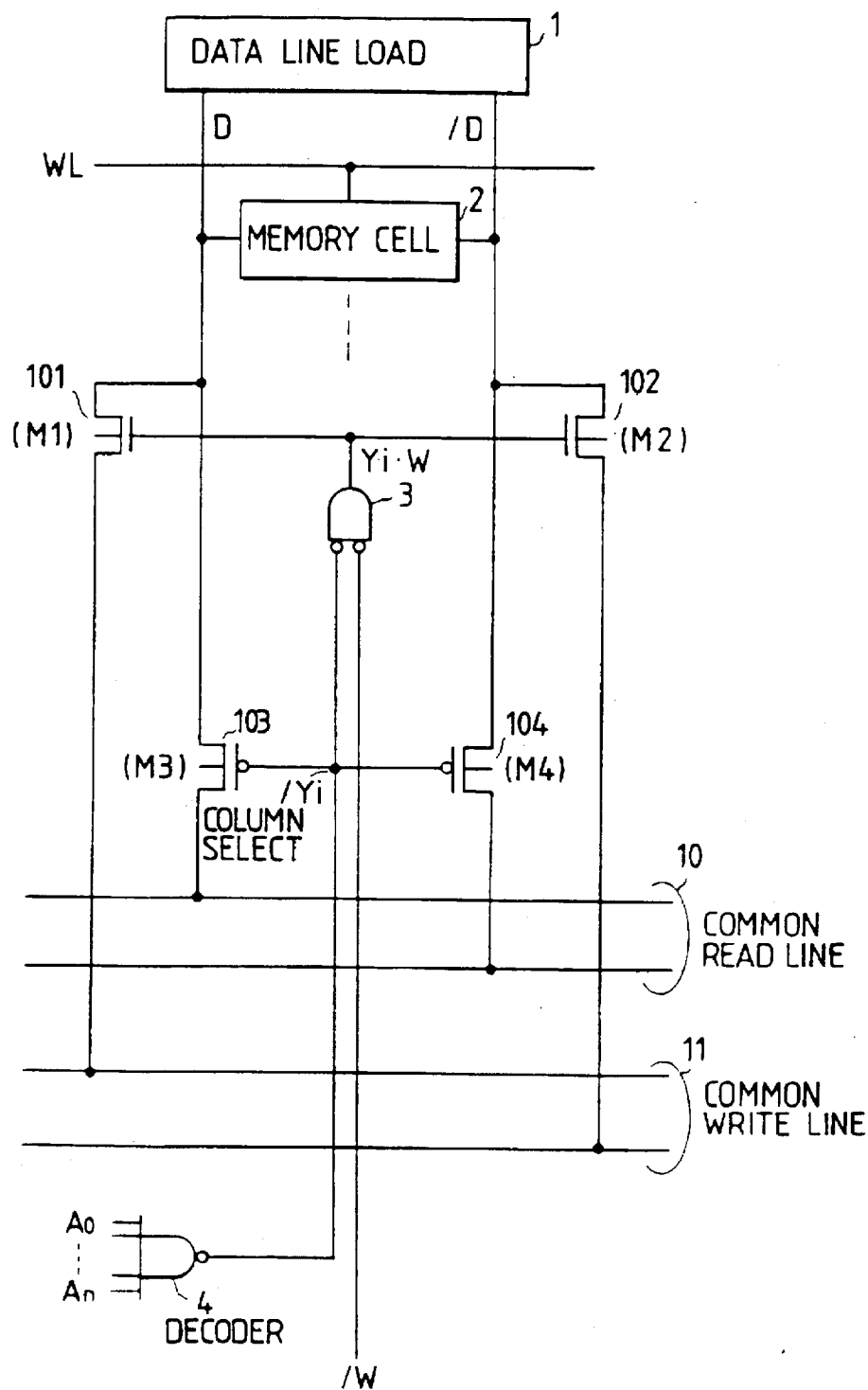
FIG. 2 is a circuit diagram showing the structure of the data reading circuit and the data writing circuit of a conventional semiconductor memory.

According to this embodiment, it is possible to forcibly turn OFF the reading transfer gates 103 (M3) and 104 (M4) by the writing control signal /W, so that the data written on the pair of data lines D, /D is not transmitted to the common read lines 10. That is, the data written into the memory cell through the data lines is not transmitted to the common read lines, which has a large load capacitance. In other words, since the potential of the common read lines is not changed by data writing, the total load capacitance which is charged and discharged at the time of writing is reduced and the high-speed writing is accomplished. At the time of recovery for restoring the potential of the data lines and the like immediately after writing to the potential which enables the reading operation, since the potential of the common read line is not changed from the potential at the time of data reading during data writing, only the data lines requires recovery, resulting in the shortening of the recovery time. This represents a significant improvement over the conventional arrangement of FIG. 2 discussed earlier.

Another embodiment of a semiconductor memory according to the present invention will now be explained.

Figure 18:
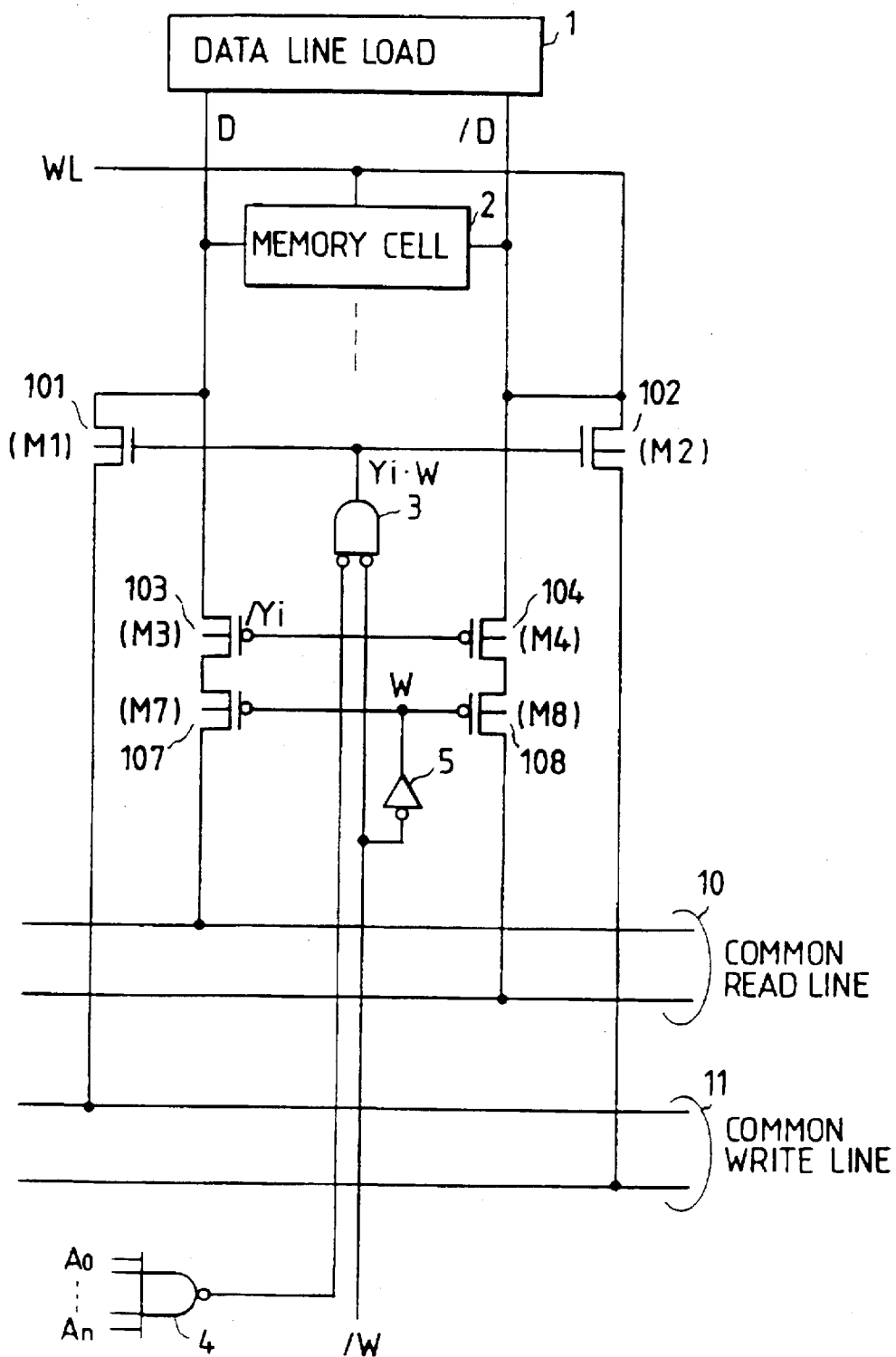
FIG. 18 is a circuit diagram showing the structure of the data reading circuit and the data writing of a further embodiment of a semiconductor memory according to the present invention.

FIG. 18 shows the structure of the data reading circuit and the data writing of a further embodiment of a semiconductor memory according to the present invention.

In FIG. 18, the same numerals and symbols are provided for the elements which are the same as those in the embodiment of FIG. 17, and explanation thereof will be omitted.

The reference numerals 103 (M3) and 104 (M4) represent first reading transfer gates which are controlled by the column select signal /Yi, numerals 107 (M7) and 108 (M8) represent second reading transfer gates which are controlled by the inverted signal of the writing control signal /W, and numeral 5 represents an inverter circuit for inverting the writing control signal /W.

The operation of this embodiment will be explained in the following.

The operation of reading the data from the memory cell is carried out by raising the word line WL so as to read the data held by the memory cell 2 in the form of a potential difference produced on the pair of data lines D, /D. In this case, since the process is in a reading cycle, the writing control signal /W is High and the column select signal /Yi is Low because it has been selected. Therefore, the output of the two-input NOR gate 3 is Low and the writing transfer gates 101 (M1) and 102 (M2) are turned OFF.

Since the column select signal /Yi is Low, the first reading transfer gates 103 (M3) and 104 (M4) are turned ON, and since the inverted signal of the writing transfer gates is Low, the second reading transfer gates 107 (M7) and 108 (M8) are turned ON.

Consequently, the potential difference produced on the pair of data lines D, /D is transmitted to the common read lines 10 and read out through the first reading transfer gates 101 (M1) and 102 (M2) and the second reading transfer gates 107 (M7) and 108 (M8).

On the other hand, at the time of data writing operation, since both the writing control signal /W and the column select signal /Yi are Low, the output of the two-input NOR gate 3 is High, and the inverted signal of the writing control signal /W becomes High. Therefore, the writing transfer gates 101 (M1) and 102 (M2) are turned ON, and the first reading transfer gates 103 (M3) and 104 (M4) are also turned ON, but the second reading transfer gates 107 (M7) and 108 (M8) are turned OFF. Therefore, the data written on the common write line 11 is transmitted to the pair of data lines D, /D through the writing transfer gates 101 (M1) and 102 (M2) and written into the memory cell 2, but is not transmitted to the common read line 10.

That is, it is possible to forcibly turn OFF the second reading transfer gates 107 and 108 at the time of writing which are provided in series with the first reading transfer gates 103 (M3) and 104 (M4), so that the data written on the pair of data lines D, /D is not transmitted to the common read line 10.

According to this embodiment, since the first reading transfer gates 103 (M3) and 104 (M4) and the second reading transfer gates 107 (M7) and 108 (M8) are connected in series, the delay time in reading is more than that in the embodiment of FIG. 17. On the other hand, it is possible to avoid the transmission of the data written in the memory cell through the data lines to the common read line which has a large load capacity, as in the embodiment of FIG. 17 by a simpler control in comparison with the embodiment of FIG. 17.

That is, the data written into the memory cell through the data lines is not transmitted to the common read lines which has a large load capacitance. In other words, since the potential of the common read lines is not changed by data writing, the total load capacitance which is charged and discharged at the time of writing is reduced, and the high-speed writing is accomplished. At the time of recovery for restoring the potential of the data lines and the like immediately after writing to the potential which enables the reading operation, since the potential of the common read line is not changed from the potential at the time of data reading, only the data lines require recovery, resulting in the shortening of the recovery time.

The entire structure of the semiconductor memory which uses the data reading circuit and the data writing circuit in the above embodiments will now be explained while citing one data reading circuit and the data writing circuit in the embodiment of FIG. 17 as an example.

Figure 19:
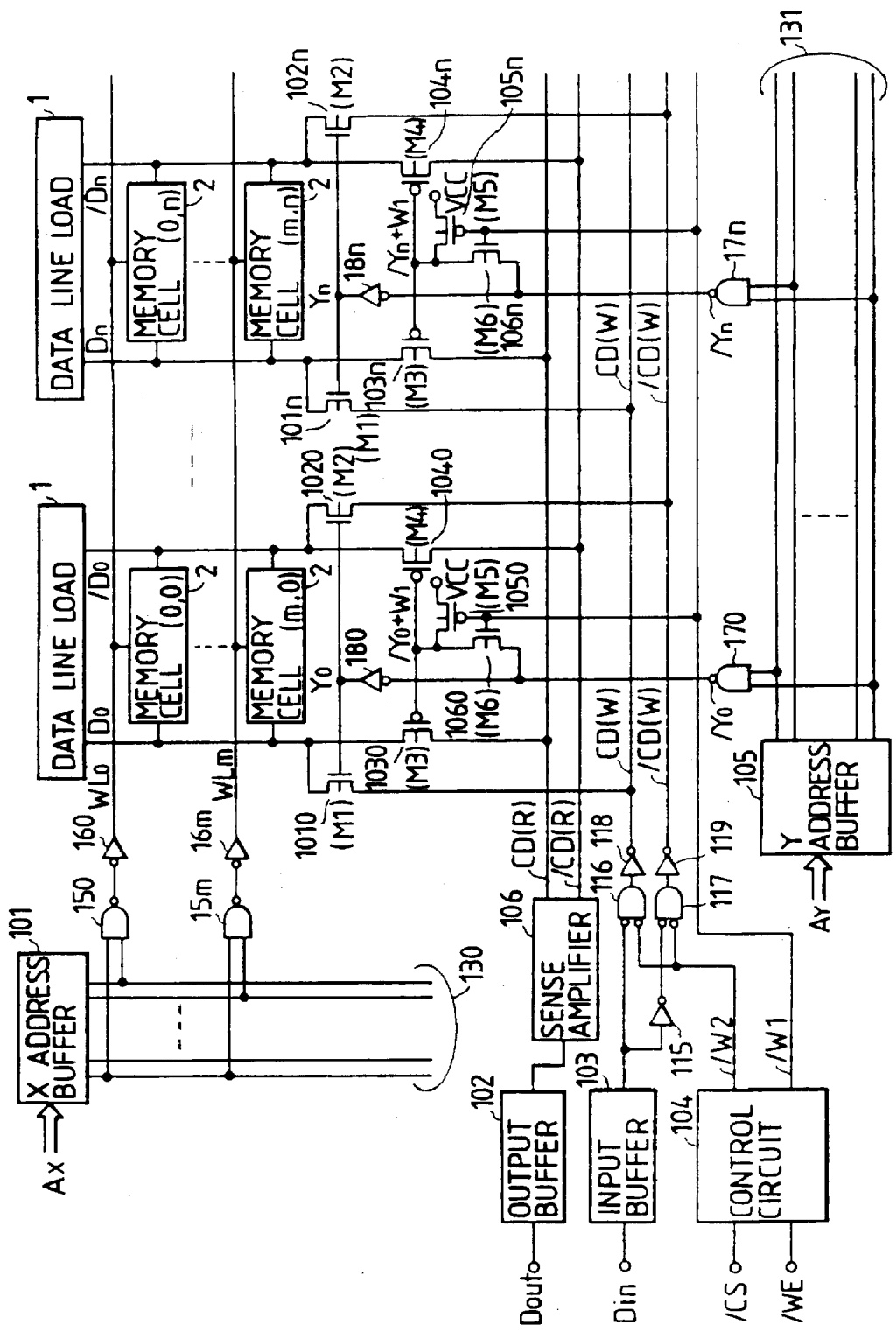
FIG. 19 is a circuit diagram of the entire structure of the embodiment of FIG. 17 showing a semiconductor memory according to the present invention.

FIG. 19 shows the entire structure of a semiconductor memory according to the embodiment of FIG. 17.

In FIG. 19, the symbols $A_X$ represent an X address signal, $A_Y$ represents a Y address signal, Dout represents an output signal, Din represents an input signal, /CS represents a chip select signal, /WE represents a write enable signal, the reference numeral 101 represents an X address buffer, 105 represents a Y address buffer, 102 represents an output buffer, 103 represents an input buffer, 104 represents a control circuit for generating writing control signals /W1 and /W2 on the basis of both the chip select signal /CS and the write enable signal /WE, 106 represents a sense amplifier for amplifying the minute voltage read out of the memory cell, 150 to 15m represents decoder circuits for decoding X address buffer outputs 130, 160 to 16m represents word line drivers, the symbols WL0 to WLm represents word lines, the reference numeral 115 represents an inverter circuit for inverting the input buffer output 116 and 117 represents two-input NOR circuits for inputting both the output of input buffer and the writing control signal /W2, 118 and 119 writing drivers, 170 to 17n represents decoder circuits for decoding Y address buffer outputs 131, 1 represents a data line load circuit, the symbols D, /D represent a pair of data lines, the reference numeral 2 represents a memory cell, 1010 (M1) and 1020 (M2) to 101n (M1) to 102n (M2) represent writing transfer gates, 1030 (M3) and 1040 (M4) to 103n (M3) and 104n (M4) represent reading transfer gates, 180 to 18n represent inverter circuits for inverting the column select signals /Y0 to Yn, VCC represents a supply voltage, 1050 (M5) and 105n (M5) represent pull-up MOSs for raising the gate voltages of the reading transfer gates 1030 (M3) and 1040 (M4) to a High level when the writing control signal /W1 is Low, 1060 (M6) to 106n (M6) represent transfer gates for transmitting the column select signals /Y0 to Yn to the transfer gates 1030 (M3) and 1040 (M4) to 102n (M3) and 104n (M4) when the write control signal /W is High, the symbols CD (R), /CD(R) represent a pair of common read lines, and CD(W) and /CD(W) represent a pair of common write lines.

Figure 20:
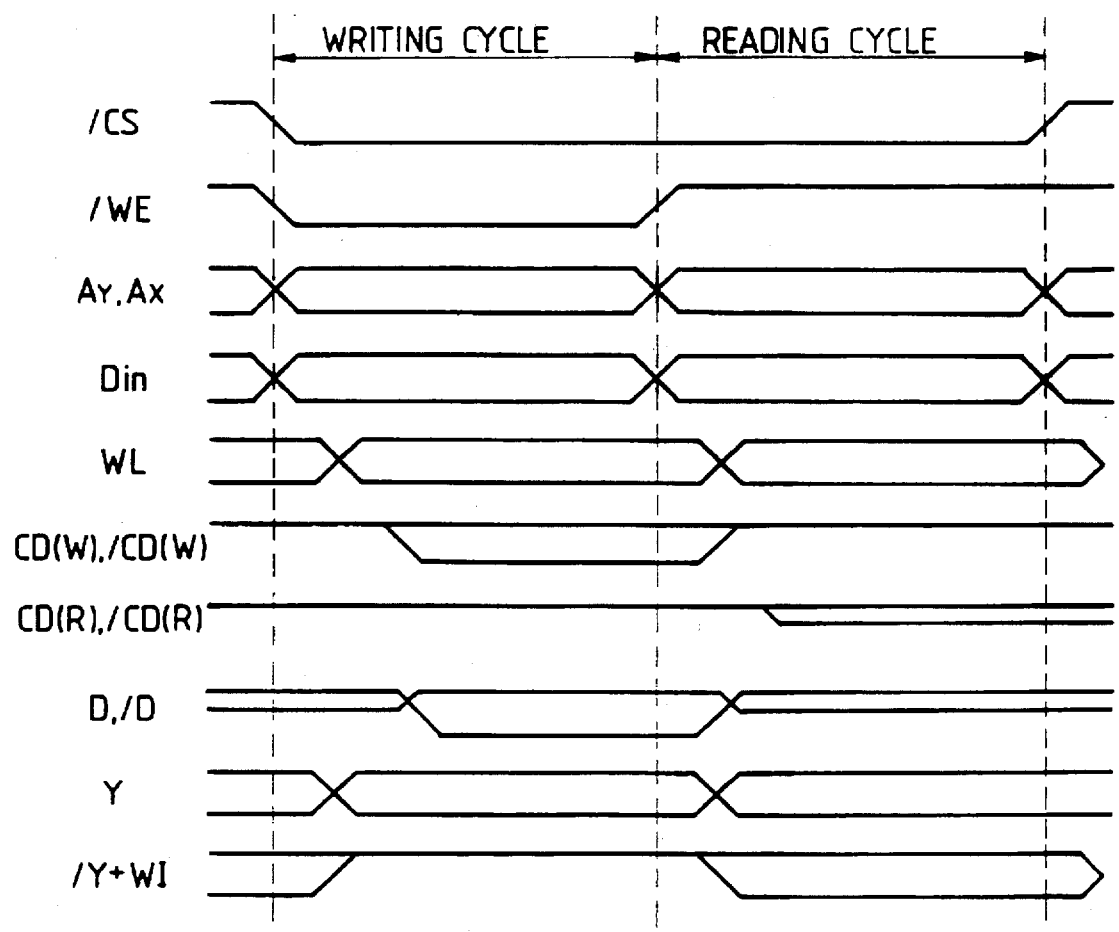
FIG. 20 is a timing chart of the operation of a semiconductor memory of FIG. 19.

The operation of the semiconductor memory will be explained with reference to FIG. 20 which shows the transitions of the input and output signals and internal signals.

In the writing cycle in which the /CS signal is Low and the /WE signal is Low, both the writing control signals /W1 and /W2 become Low. The data input from the input buffer 102 is written into the pair of common write lines CD(W), /CD(W) through the two-input NOR circuits 116 and 117 by the writing drivers 118 and 119.

The data written into the pair of common write lines CD(W), /CD(W) is written into a memory cell selected by the word lines WL0 to WLn and the column select signals /Y0 to /Yn through the writing transfer gates 1010 (M1) and 1020 (M2) to 101 (M1) and 102 (M2). At this time, all the reading transfer gates 1030 (M3) and 1040 (M4) to 103 (M3) and 104 (M4) are turned OFF because the gate voltages thereof are pulled up to a High level by the pull-up MOSs 1050 (M5) to 105 (M5) which have received the writing control signal /W1, so that the data is not written on the pair of common read lines CD(R), /CD(R).

On the other hand, in the reading cycle in which the /CS signal is Low and the /WE signal is High, both the writing control signals /W1 and /W2 are High. The column select signals /Y0 to Yn are transmitted to the reading transfer gates through the transfer gates 1060 (M6) to 106 (M6), and the pair of common write lines CD(W), /CD(W) are forced to become a High level. Therefore, the data of a memory cell selected by the word lines WL0 to WLm and the column select signals /Y0 to /Yn is read out to the pair of common read lines CD(R), /CD(R) through the reading transfer gates 1030 (M3) and 1040 (M4) to 103 (M3) and 104 (M4) and output after being amplified by the sense amplifier 106.

At this time, all the writing transfer gates 1010 (M1) and 1020 (M2) to 1010 (M1) and 102 (M2) are turned OFF because bias voltages only for turning ON the NMOS are not applied between the gates and the sources.

Figure 21:
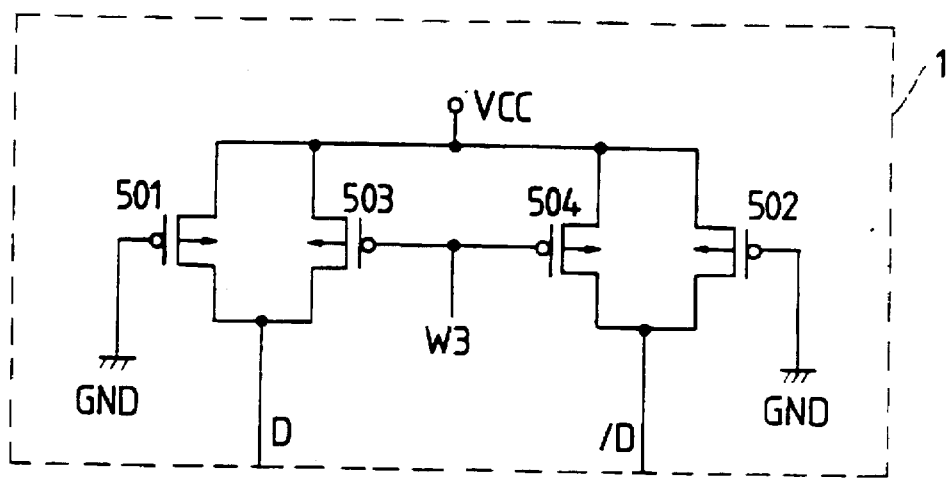
FIG. 21 is a circuit diagram showing the structure of a data line load circuit of FIG. 19.

An example of the structure of the data line load circuit 1 is shown in FIG. 21.

In FIG. 21, the symbol VCC represents a supply voltage, GND represents a grounding potential, the reference numerals 501 to 504 represent PMOSFETs, W3 represents a writing control signal, and D, /D represent a pair of data lines.

In the data line load circuit 1, in the reading cycle, the writing control signal W3 is at a Low level, and all the PMOSFETs 501, 502, 503 and 504 are turned ON, whereby the pair of data lines D, /D are strongly pulled up. In the writing cycle, the writing control signal W3 is at a High level, and all the PMOSFETs 501, 502, 503 and 504 are turned OFF, whereby the pair of data lines D, /D are less strongly pulled up by the PMOSFETs which are constantly ON.

Figure 22:
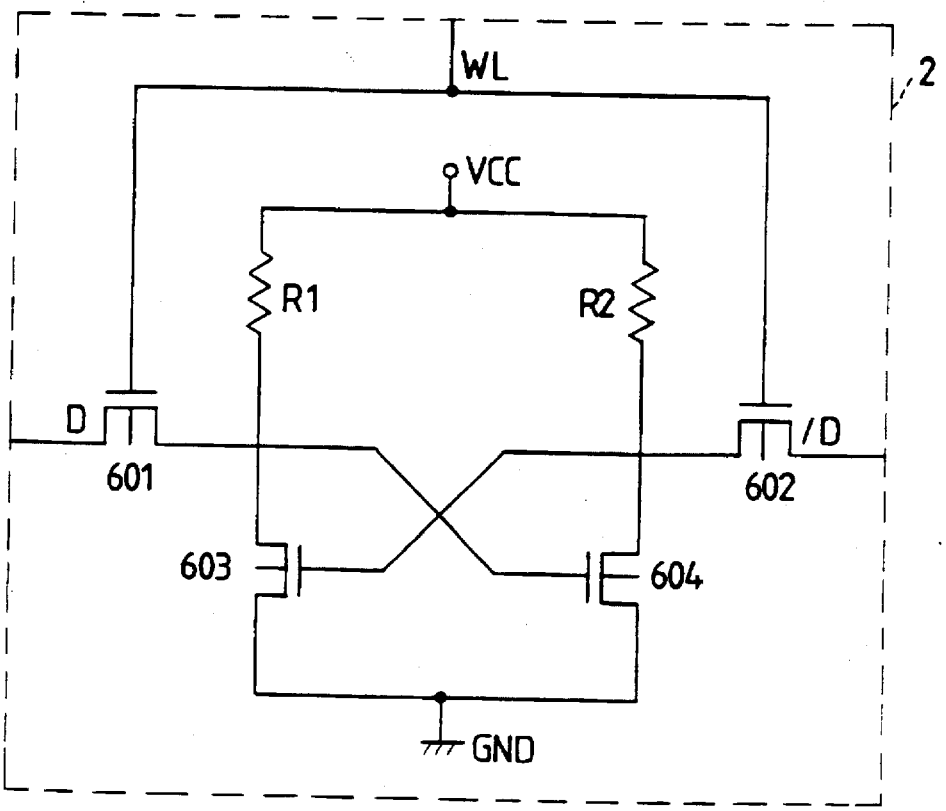
FIG. 22 is a circuit diagram showing the structure of a memory cell of FIG. 19.

An example of the structure of the memory cell 2 is shown in FIG. 22.

In FIG. 22, the symbol WL represents a word line, D, /D represent a pair of data lines, VCC represents a supply voltage, GND represents a grounding potential, R1 and R2 represent high value resistors and the reference numerals 601 to 604 represent NMOSFETs.

The operations of reading data from a memory cell and writing data into a memory cell are carried out in the state in which the word line WL is at a High level and the NMOSFETs 601 and 602 are ON.

In the above-described embodiments of a semiconductor memory according to the present invention, data written into a memory cell through the data lines is not transmitted to the common read line which has a large load capacitance. That is, since the potential of the common read line is not changed by data writing, the total load capacitance which is charged and discharged at the time of writing is reduced, and the high-speed writing is effected. At the time of recovery for restoring the potential of the data lines and the like immediately after writing to the potential which enables the reading operation, since the potential of the common read line is not changed from the potential at the time of data reading, only the data lines require recovery, resulting in the shortening of the recovery time.

As described above, according to the present invention, it is possible to provide a semiconductor memory which is capable of speeding up the data writing into a memory cell and to provide a semiconductor memory which is capable of speeding up the recovery of the data lines.

Although the preferred embodiments have been illustrated with transistors of particular conductivity types, the concepts of the present invention could all be applied to transistors having the opposite conductivity type to that shown.

It is to be understood that the above-described arrangements are simply illustrative of the application of the principles of this invention. Numerous other arrangements may be readily devised by those skilled in the art which embody the principles of the invention and fall within its spirit and scope.

We claim:

1. A semiconductor memory comprising:

a plurality of memory cells;

selecting means for selecting predetermined ones of said memory cells for reading and writing operations;

data lines respectively coupled to said memory cells;

a common write line coupled to said data lines through write transfer gates;

a common read line coupled to said data lines through read transfer gates; and a control circuit for generating a writing control signal, wherein said read transfer gates disconnect said common read line from said data lines in response to a selection signal outputted by said selecting means and said writing control signal, when writing data in a selected memory cell.

2. A semiconductor memory according to claim 1, wherein said write transfer gates are comprised of MOS transistors having a channel of a first conductivity type, and wherein said read transfer gates are comprised of MOS transistors having a channel of a second conductivity type, opposite to said first conductivity type.

3. A semiconductor memory comprising:

a plurality of memory cells;

means for selecting a predetermined one of said memory cells;

a write line for writing data into a selected memory cell;

a read line for reading data from a selected memory cell;

data lines which are connected to said memory cells and which are selectively connected to said read line through respective ones of first switches for electrically connecting a selected memory cell to said read line at a time of reading data from the selected memory cell and for electrically connecting said selected memory cell to said write line through respective ones of second switches at a time of writing data; and means for operating said first switches to disconnect said data lines from said read line at the time of writing data, said means including a control circuit for generating a writing control signal, wherein said first switches disconnect said common read line from said data lines in response to a selection signal outputted by said selecting means and said writing control signal, when writing data in a selected memory cell.

4. A semiconductor memory comprising:

a plurality of memory cells;

address circuitry for selecting a predetermined one of said memory cells;

a write line for writing data into a selected memory cell;

a read line for reading data from a selected memory cell;

data lines which are connected to said memory cells and which are selectively electrically connected to said read line through respective ones of first transfer switches at a time of reading data from a memory cell and selectively electrically connected to said write line through respective ones of second transfer switches at the time of writing data into a memory cell; and a control circuit for generating a writing control signal, wherein said first switches disconnect said common read line from said data lines in response to a selection signal outputted by said address circuitry and said writing control signal, when writing data in a selected memory cell.

5. A semiconductor memory comprising:

a memory cell array including memory cells arranged in a matrix and coupled to word lines and data lines;

an address decoder for selecting a predetermined one of said memory cells;

a common write line for writing data into each of said selected memory cells;

a common read line for reading data from each of said selected memory cells;

first means for connecting the data lines of the memory cell, selected at the time of reading data from a memory cell, to said common read line and for breaking the connection between said data lines of the memory cell, selected at the time of writing data into a memory cell, and said common read line; and second means for connecting said data lines of said memory cell, selected at the time of writing data into a memory cell, to said common write line; and a control circuit for generating a writing control signal, wherein said first means disconnects said common read line from said data lines in response to a selection signal outputted by said address decoder and said writing control signal, when writing data in a selected memory cell.

6. A semiconductor memory according to claim 2, wherein said plurality of memory cells are arranged in rows and columns, each row of memory cells being associated with a respective word line and each column of memory cells being associated with at least one data line.

7. A semiconductor memory according to claim 6, wherein a data line is selectively electrically connected to said common write line via a source-to-drain path of a MOS transistor of a corresponding transfer gate, during a write mode, in response to a column selection signal, wherein individual rows of memory cells are selected in response to word line selection signals corresponding thereto, and wherein said selecting means includes address decoding circuitry for outputting row and column selection signals.

8. A semiconductor memory according to claim 7, wherein said address decoding circuitry includes row and column decoders coupled to receive input signals corresponding to an X address and a Y address, respectively.

9. A semiconductor memory comprising:

a plurality of memory cells arranged in rows and columns and coupled to word lines and data lines, each row of memory cells being associated with a respective word line and each column of memory cells being associated with at least one data line;

selecting means for selecting predetermined ones of said memory cells for reading and writing operations, said selecting means including row and column decoders which are coupled to receive input signals corresponding to an X address and a Y address and which output row and column selection signals, respectively;

a common write line coupled to said data lines through write transfer gates;

a common read line coupled to said data lines through read transfer gates;

control means coupled to said write transfer gates and to said read transfer gates for electrically connecting predetermined ones of said data lines, coupled to a selected memory cell, to said common write line during a write operation and for disconnecting said common read line from said predetermined data lines during said write operation;

wherein said write transfer gates are comprised of MOS transistors having a channel of a first conductivity type, said read transfer gates are comprised of MOS transistors having a channel of a second conductivity type, opposite to said first conductivity type, each electrical connection of a data line to said common write lines is effected selectively through a source-to-drain path of a MOS transistor of a corresponding transfer gate, during a write mode, in response to a column selection signal, and individual rows of memory cells are selected in response to word line selection signals corresponding thereto; and wherein at least one of said row and column decoders is comprised of:

a plurality of logic gates each including a first input terminal for receiving one of first input signals, an output terminal and a common connection terminal;

a first switching element which comprises a transistor having a control electrode and first and second electrodes;

a second switching element which comprises another transistor having a control electrode and first and second electrodes;

a second input terminal, for receiving a second input signal, commonly connected to the control electrodes of the transistors of said first and second switching elements; and a second output terminal provided at a common connection of the second electrodes of the transistors of said first and second switching elements, wherein said first input signals and said second input signal are indicative of an input address, wherein said second output terminal is coupled to said common connection terminal of all of said plurality of logic gates, to thereby form a common node, and wherein said first and second switching elements operate complementary to one another in response to said second input signal.

10. A semiconductor memory according to claim 9, wherein the transistor of said first switching element is an NMOS transistor having a gate, source and drain, the transistor of said second switching element is a PMOS transistor having a gate, source and drain, the gates of said NMOS transistor and said PMOS transistor are coupled to said second input terminal, and the drains of said NMOS and said PMOS transistors are coupled to said common node.

11. A semiconductor memory according to claim 10, wherein said NMOS and PMOS transistors are coupled as a CMOS inverter in which said PMOS transistor has its source coupled to receive an operating voltage of said memory, said NMOS transistor has its source coupled to receive either a predetermined reference potential or a logic signal output by a further CMOS inverter which has an input fed with a control signal, and said PMOS and NMOS transistors have drains commonly connected to said common node and gates commonly connected to said second input terminal.

12. A semiconductor memory according to claim 9, wherein each of said logic gates includes a first MOS transistor having a gate coupled to a corresponding said first input terminal and a source-drain path coupled between said output terminal thereof and said common node.

13. A semiconductor memory comprising:

a plurality of memory cells arranged in rows and columns and coupled to word lines and data lines, each row of memory cells being associated with a respective word line and each column of memory cells being associated with at least one data line;

selecting means for selecting predetermined ones of said memory cells for reading and writing operations, said selecting means including row and column decoders which are coupled to receive input signals corresponding to an X address and a Y address and which output row and column selection signals, respectively;

a common write line coupled to said data lines through write transfer gates;

a common read line coupled to said data lines through read transfer gates;

control means coupled to said write transfer gates and to said read transfer gates for electrically connecting predetermined ones of said data lines, coupled a selected memory cell, to said common write line during a write operation and for disconnecting said common read line from said predetermined data lines during said write operation;

wherein said write transfer gates are comprised of MOS transistors having a channel of a first conductivity type, said read transfer gates are comprised of MOS transistors having a channel of a second conductivity type, opposite to said first conductivity type, each electrical connection of a data line to said common write lines is effected selectively through a source-to-drain path of a MOS transistor of a corresponding transfer gate, during a write mode, in response to a column selection signal, and individual rows of memory cells are selected in response to word line selection signals corresponding thereto; and wherein at least one of said row and column decoders is comprised of:

a plurality of logic gates coupled to a common node, respectively, each logic gate including a first input terminal for receiving ones of first input signals;

a first switching element coupled to said common node; and a second switching element coupled to said common node, wherein said first and second switching elements are both coupled to a second input terminal for receiving a second input signal which is common to said plurality of logic gates, said first and second switching elements operating complementary to one another in response to said second input signal, wherein said first input signals and said second input signal are indicative of an input address, and wherein each of said logic gates is comprised of a first MOS transistor having a gate coupled to said first input terminal thereof and a source-drain path coupled to said common node, and a second MOS transistor having a channel region of opposite conductivity type to the conductivity type of a channel region of said first MOS transistor, said second MOS transistor having a gate supplied with a predetermined reference potential and a source-drain path coupled in series with the source-drain path of said first MOS transistor between a power source potential terminal and said common node.

14. A semiconductor memory according to claim 13, wherein said predetermined reference potential is set at a value to keep said second MOS transistor in a constant ON state.

15. A semiconductor memory according to claim 13, wherein said first MOS transistor is a NMOS transistor, and wherein said second MOS transistor is a PMOS transistor.

16. A semiconductor memory according to claim 15, wherein said first switching element comprises a second NMOS transistor and said second switching element comprises a second PMOS transistor, said second NMOS transistor and said second PMOS transistor having gates thereof which are respectively coupled to said second input terminal and source-drain paths thereof which are respectively coupled to said common node.

17. A semiconductor memory according to claim 16, wherein said predetermined reference potential is set at ground to keep said second MOS transistor in a constant ON state.

18. A semiconductor memory according to claim 17, wherein an output terminal for each of said logic gates is provided between said source-drain paths of said first and second MOS transistors.

19. A semiconductor memory according to claim 18, further comprising a third switching element and a fourth switching element, wherein said third switching element includes a third NMOS transistor and said fourth switching element includes a third PMOS transistor, said third NMOS and PMOS transistors having gates coupled to a third input terminal for receiving a third input signal, and having source-drain paths commonly coupled, on the drain sides thereof, to a second common node which acts as an output providing the logic invert of said third input signal, wherein said plurality of logic gates includes first and second groups of logic gates, and wherein each NMOS transistor of the logic gates of said first group has its source thereof connected to said common node and to the drains of said second NMOS and PMOS transistors, the source of said second NMOS transistor being connected to said second common node which also commonly couples the output of said third NMOS and PMOS transistors to said second group of logic gates.

20. A semiconductor memory comprising:

a plurality of memory cells arranged in rows and columns and coupled to word lines and data lines, each row of memory cells being associated with a respective word line and each column of memory cells being associated with at least one data line;

selecting means for selecting predetermined ones of said memory cells for reading and writing operations, said selecting means including row and column decoders which are coupled to receive input signals corresponding to an X address and a Y address and which output row and column selection signals, respectively;

a common write line coupled to said data lines through write transfer gates;

a common read line coupled to said data lines through read transfer gates;

control means coupled to said write transfer gates and to said read transfer gates for electrically connecting predetermined ones of said data lines, coupled to a selected memory cell, to said common write line during a write operation and for disconnecting said common read line from said predetermined data lines during said write operation;

wherein said write transfer gates are comprised of MOS transistors having a channel of a first conductivity type, said read transfer gates are comprised of MOS transistors having a channel of a second conductivity type, opposite to said first conductivity type, each electrical connection of a data line to said common write lines is effected selectively through a source-to-drain path of a MOS transistor of a corresponding transfer gate, during a write mode, in response to a column selection signal, and individual rows of memory cells are selected in response to word line selection signals corresponding thereto; and wherein at least one of said row and column decoders is comprised of:
   a plurality of logic gates each including a first input terminal for receiving ones of first input signals, wherein said logic gates are coupled to a common node, respectively;
   a first switching element coupled to said common node;
   a second switching element coupled to said common node,
      wherein said first and second switching elements are both coupled to a second input terminal for receiving a second input signal which is common to said plurality of logic gates, and
      wherein said first and second switching elements operate complementary to one another in response to said second input signal; and
   a switching circuit coupled to said common node,
      wherein said switching circuit is coupled to a third input terminal for receiving a third input signal, said third input signal together with said first input signals and said second input signal are indicative of an input address.

21. A semiconductor memory according to claim 20, wherein said switching circuit is comprised of at least one field effect transistor and at least one bipolar transistor.

22. A semiconductor memory comprising:
   a plurality of memory cells arranged in rows and columns and coupled to word lines and data lines, each row of memory cells being associated with a respective word line and each column of memory cells being associated with at least one data line;
   selecting means for selecting predetermined ones of said memory cells for reading and writing operations, said selecting means including row and column decoders which are coupled to receive input signals corresponding to an X address and a Y address and which output row and column selection signals, respectively;
   a common write line coupled to said data lines through write transfer gates;
   a common read line coupled to said data lines through read transfer gates;
   control means coupled to said write transfer gates and to said read transfer gates for electrically connecting predetermined ones of said data lines, coupled to a selected memory cell, to said common write line during a write operation and for disconnecting said common read line from said predetermined data lines during said write operation;
   wherein said write transfer gates are comprised of MOS transistors having a channel of a first conductivity type, said read transfer gates are comprised of MOS transistors having a channel of a second conductivity type, opposite to said first conductivity type, each electrical connection of a data line to said common write lines is effected selectively through a source-to-drain path of a MOS transistor of a corresponding transfer gate, during a write mode, in response to a column selection signal, and individual rows of memory cells are selected in response to word line selection signals corresponding thereto; and wherein at least one of said row and column decoders is comprised of:
   a plurality of logic gates each including a first input terminal for receiving ones of first input signals, wherein said logic gates are coupled to a common node, respectively;
   a first switching element coupled to said common node;
   a second switching element coupled to said common node,
      wherein said first switching element comprises an NMOS transistor, and said second switching element comprises a PMOS transistor, gates of both said NMOS transistor and said PMOS transistor are coupled to a second input terminal for receiving a second input signal which is common to said plurality of logic gates, and source-drain paths of said NMOS transistor and said PMOS transistor are coupled to said common node; and
   a switching circuit coupled to said common node through said source-drain path of said NMOS transistor of said first switching element,
      wherein said switching circuit is coupled to a third input terminal for receiving a third input signal, said third input signal together with said first input signals and said second input signal are indicative of an input address.

23. A semiconductor memory according to claim 22, wherein said switching circuit is comprised of at least one field effect transistor and at least one bipolar transistor.

24. A semiconductor memory comprising:
   a plurality of memory cells arranged in rows and columns and coupled to word lines and data lines, each row of memory cells being associated with a respective word line and each column of memory cells being associated with at least one data line;
   selecting means for selecting predetermined ones of said memory cells for reading and writing operations, said selecting means including row and column decoders which are coupled to receive input signals corresponding to an X address and a Y address and which output row and column selection signals, respectively;
   a common write line coupled to said data lines through write transfer gates;
   a common read line coupled to said data lines through read transfer gates;
   control means coupled to said write transfer gates and to said read transfer gates for electrically connecting predetermined ones of said data lines, coupled to a selected memory cell, to said common write line during a write operation and for disconnecting said common read line from said predetermined data lines during said write operation;
   wherein said write transfer gates are comprised of MOS transistors having a channel of a first conductivity type, said read transfer gates are comprised of MOS transistors having a channel of a second conductivity type, opposite to said first conductivity type, each electrical connection of a data line to said common write lines is effected selectively through a source-to-drain path of a MOS transistor of a corresponding transfer gate, during a write mode, in response to a column selection signal, and individual rows of memory cells are selected in response to word line selection signals corresponding thereto; and wherein at least one of said row and column decoders is comprised of:

a plurality of logic gates, each logic gate including a first input terminal for respectively receiving first input signals and being coupled to a common node;

a first switching element coupled to said common node; and a plurality of second switching elements, coupled to said common node, provided for all of said logic gates, wherein said first switching element and said second switching elements are coupled to a second input terminal for receiving a second input signal which is common to said plurality of logic gates, and further wherein said second switching elements, in combination, operate in a manner complementary to that of said first switching element in response to said second input signal, said first input signals and said second input signal being indicative of an input address.

25. A semiconductor memory according to claim 24, wherein each of said logic gates includes a first MOS transistor having a gate coupled to said corresponding first input terminal and a source-drain path coupled to said common node, and a second MOS transistor having a channel region of opposite conductivity type to the conductivity type of a channel region of the first MOS transistor, said second MOS transistor having a gate coupled to said first input terminal of said logic gate and a source-drain path coupled in series between a power source potential and the source-drain path of said first MOS transistor.

26. A semiconductor memory according to claim 25, wherein said first switching element comprises a NMOS transistor, wherein said second switching elements include at least a PMOS transistor, wherein a gate of said NMOS transistor of said first switching element and a gate of said PMOS transistor of said second switching elements are respectively coupled to said second input terminal, wherein a source-drain path of said NMOS transistor of said first switching element is coupled to said common node, and wherein said NMOS transistor and said second switching elements, in combination, are respectively coupled to provide pull-down and pull-up level action at said common node in response to said second input signal.

27. A semiconductor memory according to claim 26, wherein said first MOS transistor is a NMOS transistor, and wherein said second MOS transistor is a PMOS transistor.

28. A semiconductor memory according to claim 27, further comprising a switching circuit coupled to said common node through said source-drain path of said NMOS transistor of said first switching element, wherein said switching circuit is coupled to a third input terminal for receiving a third input signal.

29. A semiconductor memory according to claim 28, wherein said third switching circuit is comprised of at least one field effect transistor and at least one bipolar transistor.

30. A semiconductor memory according to claim 25, wherein said first switching element includes a NMOS transistor and said second switching elements comprise a CMOS inverting circuit and a pull-up connected bipolar transistor, said CMOS inverting circuit having an input coupled, in common with a gate of said NMOS transistor, to receive said second input signal and having an output coupled to said pull-up connected bipolar transistor, said bipolar transistor and said NMOS transistor being series-connected across a voltage potential corresponding to an operating potential of said memory, and the common coupling of said bipolar transistor with said NMOS transistor, operating as a pull-down transistor, providing an output to said common node which operates as another, common input terminal of said plurality of logic gates.

31. A semiconductor memory according to claim 24, wherein said first switching element and said plurality of second switching elements are coupled to provide the logic invert, at said common node, of said second input signal.

32. A semiconductor memory according to claim 24, wherein said first switching element and said plurality of second switching elements constitute a BiCMOS inverter.

33. A semiconductor memory according to claim 24, wherein said first switching element includes a NMOS transistor and said second switching elements comprise a CMOS inverting circuit and a pull-up connected bipolar transistor, said CMOS inverting circuit having an input coupled, in common with a gate of said NMOS transistor, to receive said second input signal and having an output coupled to said pull-up connected bipolar transistor, said bipolar transistor and said NMOS transistor being series-connected across a voltage potential corresponding to an operating potential of said memory, and the common coupling of said bipolar transistor with said NMOS transistor, operating as a pull-down transistor, providing an output to said common node which operates as another, common input terminal of said plurality of logic gates.

34. A semiconductor memory comprising:

a plurality of memory cells arranged in rows and columns and coupled to word lines and data lines, each row of memory cells being associated with a respective word line and each column of memory cells being associated with at least one data line;

selecting means for selecting predetermined ones of said memory cells for reading and writing operations, said selecting means including row and column decoders which are coupled to receive input signals corresponding to an X address and a Y address and which output row and column selection signals, respectively;

a common write line coupled to said data lines through write transfer gates;

a common read line coupled to said data lines through read transfer gates;

control means coupled to said write transfer gates and to said read transfer gates for electrically connecting predetermined ones of said data lines, coupled to a selected memory cell, to said common write line during a write operation and for disconnecting said common read line from said predetermined data lines during said write operation;

wherein said write transfer gates are comprised of MOS transistors having a channel of a first conductivity type, said read transfer gates are comprised of MOS transistors having a channel of a second conductivity type, opposite to said first conductivity type, each electrical connection of a data line to said common write lines is effected selectively through a source-to-drain path of a MOS transistor of a corresponding transfer gate, during a write mode, in response to a column selection signal, and individual rows of memory cells are selected in response to word line selection signals corresponding thereto; and wherein at least one of said row and column decoders is comprised of:
- a plurality of logic gate each including a first input terminal for receiving ones of first input signals, said plurality of logic gates being coupled to a common node, respectively;
- a first switching element coupled to said common node;
- a second switching element coupled to said common node, said first switching element comprising an NMOS transistor and said second switching element comprising a PMOS transistor, gates of both said NMOS transistor and said PMOS transistor being coupled to a second input terminal for receiving a second input signal which is common to said plurality of logic gates, and source-drain paths of said NMOS transistor and said PMOS transistor being coupled to said common node; and
- a third switching element coupled to said common node through said source-drain path of said NMOS transistor of said first switching element, said third switching element being coupled to a third input terminal for receiving a third input signal, and the first through third input signals being indicative of an input address in which the second and third signals function as control signals, respectively.

* * * * *